United States Patent
Farah

(10) Patent No.: US 7,512,297 B2
(45) Date of Patent: Mar. 31, 2009

(54) POLYMIDE SUBSTRATE BONDED TO OTHER SUBSTRATE

(76) Inventor: John Farah, 60 Phillips St., Bldg. 3, Apt. 2, Attleboro, MA (US) 02703

( * ) Notice: Subject to any disclaimer, the term of this patent is extended or adjusted under 35 U.S.C. 154(b) by 0 days.

(21) Appl. No.: 11/865,537

(22) Filed: Oct. 1, 2007

(65) Prior Publication Data

US 2008/0089637 A1 Apr. 17, 2008

Related U.S. Application Data

(63) Continuation-in-part of application No. 11/265,878, filed on Nov. 2, 2005, now abandoned, which is a continuation-in-part of application No. PCT/US2004/013493, filed on May 3, 2004, which is a continuation of application No. 10/429,080, filed on May 2, 2003, now Pat. No. 6,807,328.

(51) Int. Cl.
*G02B 6/12* (2006.01)
*B29C 59/00* (2006.01)
*B29C 59/16* (2006.01)

(52) U.S. Cl. ............................. 385/14; 264/39; 264/400

(58) Field of Classification Search .................. None
See application file for complete search history.

(56) References Cited

U.S. PATENT DOCUMENTS

| 4,314,260 A | * | 2/1982 | Drexler ................... 346/135.1 |
| 5,051,784 A | * | 9/1991 | Yamamoto et al. .......... 399/329 |
| 5,976,710 A | * | 11/1999 | Sachdev et al. ............. 428/620 |
| 6,563,195 B1 | * | 5/2003 | Tomaru et al. .............. 257/620 |
| 6,563,998 B1 | * | 5/2003 | Farah et al. ................ 385/131 |
| 6,750,320 B2 | * | 6/2004 | Moroi et al. ................ 528/480 |

\* cited by examiner

*Primary Examiner*—Omar Rojas

(57) ABSTRACT

Polyimide substrates, and polymer laminates for optical and electronic applications are described. Single or multi-layer waveguide structures are deposited on the polyimide substrates. Laminates including polymer or a hybrid organic/inorganic waveguiding film can be deposited on a polished polyimide substrate. The laminate can also include piezoelectric and metallic layers. Micromachined optical devices, such as cantilevered waveguide are fabricated by laser ablation using a combination of IR and UV lasers. A fiber-to-waveguide coupler with a laser-machined groove for holding the fiber is also disclosed. Holes are drilled with excimer and YAG laser in the polyimide substrate and metallized to provide continuous electrical contact between both sides of the substrate. Metallized polyimide substrates are bumped and stacked to provide high density interconnects. The polyimide substrate is bonded to a semiconductor wafer. Thin SOI or epitaxially grown layer with devices is transferred to the polyimide substrate by grinding and etching the semiconductor wafer.

20 Claims, 14 Drawing Sheets

POLYMIDE SUBSTRATE BONDED TO OTHER SUBSTRATE

CROSS REFERENCE TO RELATED APPLICATIONS

This application is a continuation-in-part of application Ser. No. 11/265,878 filed on Nov. 2, 2005, which is a continuation-in-part of International Application Number PCT/US/2004/013493 filed on May 3, 2004, which designates the United States (US). PCT/US/2004/013493 claims priority to U.S. application Ser. No. 10/429,080 filed on May 2, 2003. The entire disclosure of each of U.S. application Ser. No. 11/265,878, PCT/US/2004/013493 and U.S. application Ser. No. 10/429,080 are herein incorporated by reference.

FIELD OF THE INVENTION

This invention relates to polyimide substrates, and more particularly polished polyimide substrates, which are bonded to other substrates including semiconductor wafers carrying circuits and devices, such as solar cells, for optical and electronic applications. This invention also relates to metallized and stacked polyimide substrates for optical and electronic interconnects.

BACKGROUND OF THE INVENTION

Optical waveguide devices are typically made on silicon substrates. It is desirable that materials used for optical waveguides exhibit certain optical, thermal and mechanical characteristics, besides low optical loss. Common silicon micromachining technologies include anisotropic wet etching and dry reactive ion etching (RIE). Passive optical waveguides exhibiting acceptable losses between 0.1 and 10 dB/cm have been demonstrated in a number of materials, most notably optical grade glasses (silica) and PMMA and polystyrene polymers. The highest quality silica waveguides with very low losses of 0.1 dB/cm have been deposited on silicon wafers by flame hydrolysis, which yields good control over the index and thickness of the film but requires heating the porous glass layer to 1250° C. for consolidation. This high temperature perturbs the crystallographic microstructure of silicon, which affects its anisotropic wet etching. Furthermore, the flame hydrolysis technique requires specialized and expensive equipment and involves the use of silane, which is a toxic gas.

The fabrication of ridge waveguides in silica and polymer requires etching to a depth of several microns. Deep vertical sidewalls with high aspect ratios can be obtained in silicon with RIE. However, RIE is an expensive process, which requires the use of high vacuum equipment. Deep RIE requires the use of high selectivity gases and appropriate masking layers. Silicon dioxide can be used effectively to mask silicon because it has a very high selectivity ratio of 200:1 for certain etching gases. This allows etching of several hundred microns deep silicon structure with an oxide layer of only a few microns. Deep etching of polyimide is problematic because there is no known masking material with high selectivity ratio toward polyimide. A polyimide substrate cannot withstand the high temperatures necessary to deposit an oxide film. Photoresist, being a polymer, does not have high selectivity toward polyimide. Metallic films, such as titanium or aluminum, are used effectively to mask polyimide. However, etching of polyimide has been limited to a depth of a few microns due to erosion of the metal masking layer. The highly energetic plasma ions cause the metallic layer to sputter and deposit metal particles on the polyimide terminating the etching. The lack of suitable masking material for polyimide has been a limiting factor in the use of RIE.

It is desired in certain applications to incline the end faces of cantilevered film waveguides relative to the axis of the waveguide, especially at air gaps between cantilevered and fixed waveguides. This cannot be readily achieved with RIE because the electric field lines in a plasma, which define the trajectory of the energetic ions terminate perpendicularly to the wafer surface. Thus, the desired oblique walls at the end faces cannot be obtained with silicon micromachining technology.

Silicon micromachined cantilevers carrying film waveguides have made use of films such as silicon dioxide (silica) and nitride. There are problems associated with fabricating microstructures from the bulk of silicon substrates, for example the undercutting of convex corners, which alters the shape of microstructures, e.g. the inertial mass at the end of a cantilever. This prevents the reproducible fabrication of microstructures with 90° corners. This problem can be partially corrected with the use of proper corner compensation in the mask layout, however this requires significant experimentation by trial and error to determine the correct compensation for each mask design. Another problem with using silica films for waveguides in micro-mechanical applications, which is not encountered in micro-electronic processing, is that thick films (up to 50 μm) are needed. The problem with thick films is that they tend to crack and peel off due to the large residual stresses built-in during deposition due to the mismatch between the coefficients of thermal expansion of the film and substrate. Furthermore, the deposition of silica films is not compatible with silicon micromachining because it requires heating the wafer to a very high temperature, which may alter the crystallinity of silicon on which anisotropic etching depends. Another drawback of high silica films is the necessity of deep RIE to form ridge waveguides, which is an expensive process and which is limited due to mask erosion.

Certain polymers have been used as waveguide materials. Low loss polymer waveguides have been most commonly achieved in poly-methyl-methacrylate (PMMA) or polystyrene. However, polymers are affected by bases such as KOH or NaOH, which are used in anisotropic silicon micromachining. The use of polyimides on silicon presents problems in regards to wet and dry etching and to the mismatch in the coefficient of thermal expansion, so that polyimide films on silicon wafers tend to have limited utility in fabricating micromachined structures for optical wave guiding applications.

Polymer film waveguides that are spun cast on planar substrates exhibit thermal and optical properties that are dependent on the deposition parameters. In particular, the degree of anisotropy, such as the difference between the indices of refraction (birefringence), and the difference between the coefficients of thermal expansion (CTEs) along directions that are perpendicular and parallel to the surface of the substrate, depend on the level of stress that is induced in the film during fabrication due to the mismatch between the planar CTEs of the film and substrate. For mechanical ruggedness and in order to avoid peeling off or delamination of the film, it is desired to reduce the CTE mismatch as this reduces the level of stress at the interface between the film and substrate. For optical and especially wave guiding applications, it is desired to reduce the birefringence of the film. The planar CTE of a highly anisotropic polymeric film can be as low as 6 ppm/° C., while the perpendicular CTE can be as high as 150 ppm/° C. An isotropic polymeric film has both parallel and perpendicular CTEs about 50 ppm/° C. Most polymers have CTEs that are considerably larger than that of silicon, which is about 3 ppm/° C. When polymeric films are deposited on silicon wafers for electronic applications, the planar CTE of the film is chosen as small as possible to minimize the mismatch with silicon. While this reduces the stresses, it creates a highly anisotropic film, which is undesirable for optical wave guiding applications. Thus, it has not been possible to simultaneously reduce the stresses and minimize anisotropy and birefringence in a polymeric film on a silicon wafer.

The residual side wall angle of a wet etched film is unpredictable due to the swelling when a developed film dries at elevated temperatures. This is aggravated in multilayered films because the solvents of subsequent layers attack the edges of the previous layer at the interface between the layers resulting in uneven side walls.

The properties of most materials change with temperature. The index of refraction is tuned thermally through the thermo-optic coefficient, which is the rate of change of index with temperature. The optical length of a light path is the product of its physical length times the index. A change in temperature causes a variation in length due to thermal strain and a change in index due to the thermo-optic effect. Thermal tuning is used in interferometric devices to change the phase and intensity of light passing through a waveguide. It is desired to achieve temperature-insensitive or athermal design in order to minimize the dependence of the output of optical devices on environmental disturbances, such as fluctuations in temperature. It is important to stabilize the center wavelengths of multi-channel devices such as optical filters, which tend to drift. Further, athermal design lessens the dependence on the polarization of light, which is desirable. This has necessitated the use of temperature control units, which utilize a heater or a Peltier cooler to maintain the temperature of the device constant. Temperature control requires constant electrical power consumption of a few watts and dedicated electronic circuits, which is costly and undesirable. Uncontrolled athermal operation is achieved by balancing the effects of the variations of index and length so that the net change in optical path length is zero. This can be achieved by equating the thermo-optic coefficient to the negative of the product of the index of the film times the CTE of the substrate, assuming that the film is sufficiently thinner than the substrate. This requires films with negative thermo-optic coefficients. Some polymer waveguide materials, such as fluorinated acrylates, have a negative thermo-optic coefficient, which is approximately equal to the product of the index of the film and the CTE of polymer substrates. Thus, athermal design can be achieved with the use of certain polymer films and substrates. However, it is not possible to tune such an optical device thermally due to its temperature-insensitive design.

Quartz and ceramic substrates, such as alumina ($Al_2O_3$) are used for RF applications. Metal conductor lines are deposited on the substrates for microwave transmission. The substrate is polished to reduce the loss at the substrate/metal interface. Both materials have extremely low dissipation factors, also known as loss tangent. Quartz has a dielectric constant of about 3.8, while alumina is about 9.9. There is constant drive in the industry to use higher frequencies beyond 30 GHz into the millimeter wave range. As the frequency increases a larger portion of the wave travels in the substrate, a phenomenon known as skin effect. A substrate with a certain thickness can support multiple modes at higher frequency. It is desirable to transmit only the fundamental mode. It is preferable to limit the thickness of the substrate to a maximum corresponding to the cut-off of higher order modes. The maximum thickness for single mode transmission depends on the dielectric constant of the substrate. An alumina substrate, for example, should not be thicker than 250 µm for frequencies above 10 GHz. The use of a very thin substrate is undesirable because it is fragile. A substrate with a lower dielectric constant, such as quartz, can be thicker, for example 500 µm while supporting a single mode at the same frequencies. It is preferable to use thicker substrates with low dielectric constant in the range of 3 to 4 for higher frequencies because it is cheaper to fabricate and easier to handle. However, the use of quartz for RF substrates has been problematic because it is expensive and brittle.

When a silicon wafer carrying a polymer film is cut or cleaved, the polymer film tends to lift off and hang over the cut edge of the wafer. The width of the lifted-off regions can extend up to 300 µm inward from the edge. This necessitates removing the entire lifted region of the film, for example by ablating with a laser to improve coupling of light in and out of the waveguide. However, this is problematic because it creates a relatively long step that the light must traverse between the edge of the wafer and the edge of the film. If this step is at the input edge of the waveguide where light is focused as a cone or wedge then a substantial portion of the light can be blocked off. If the step is at the output edge then it interferes with the collection of the light by a lens for feeding into a pick up fiber. This step is particularly problematic over silicon wafers. It was necessary to control the end face of a polymer channel waveguide within 5 µm from the cleaved silicon substrate edge in order to achieve acceptable coupling of the light (J. C. Chon and P. B. Comita, "Laser ablation of nonlinear-optical polymers to define low-loss optical channel waveguides" Opt. Lett. 19, 1840, 1994). The cleavage of the silicon wafer must be done very carefully so that the least amount of film is peeled off at the cleaved edges.

To couple light in and out of single mode channel waveguides single mode optical fibers are typically attached to the end of the waveguides. This requires alignment of the axes of the fiber and waveguide with submicron accuracy. For example, V-grooves can be etched in silicon substrates and the alignment between the fiber and waveguide is adjusted while actively monitoring the coupling efficiency. At the point of maximum efficiency, the fiber is attached to the substrate. It would be desirable to couple light efficiently between single mode fiber and waveguide passively without monitoring the light intensity during the attachment.

Micro-electro-mechanical (MEMS) devices are fabricated on silicon wafers either by surface micromachining of thin layers deposited on the silicon substrate, or by bulk micromachining of the MEMS structure in the silicon wafer. Bulk-micromachined structures are larger, sturdier and have higher resonant frequencies. Surface-micromachined structures are smaller, flimsier and have lower resonant frequencies. However, bulk-micromachined structures require more driving force and power to move or bend using thin actuating films.

Piezoelectric films, such as PZT or ZnO or AlN, are useful to actuate surface or bulk micromachined MEMS structures, such as cantilevers. It is also desirable to etch deep microstructures with high aspect ratios for the fabrication of micromechanical devices, such as accelerometers and optical switches. The piezoelectric films are layered between metallic films, such as Pt or Al, which form the electrodes. The piezoelectric films are patterned along with the metallic films. RIE has been used to pattern ZnO; and Argon ion beam milling has been used to pattern PZT, both of which are expensive dry etching techniques. A problem with dry etching has been poor selectivity, i.e. the etch rate of the masking layer or other layers in the structure can be comparable to or even exceed the etch rate of the layer that is intended to be etched. This causes low yield and poor dimensional control of ZnO devices, and poor selectivity toward PZT relative to the metallic layers. It also limits the etch depth of MEMS devices to the thickness of the mask layer, and necessitates the use of extra masking layers, which is undesirable.

Polyimide substrates can be used to package microelectronic components, such as chips. Other materials are currently used to accomplish this task including organic and ceramic substrates. As chip functionality becomes more sophisticated and pin count increases, it becomes necessary to provide higher density interconnects among the chips. It is often necessary to route the signals through multi-level substrates in order to avoid wire crossings. This is accomplished by drilling vertical vias in each of the layers of the substrate, which are covered by contact pads on each side of the wafer. Higher density is achieved by reducing the cross-section of the metallic traces in each layer and by reducing the diameter and spacing between holes. Microvias are commonly drilled with lasers, such as excimer or tripled YAG. Very narrow holes with diameters down to 25 µms can be achieved routinely. However, it has been difficult to coat the cylindrical wall of a hole with an aspect ratio greater than 1:1 reliably.

Organic substrate fabrication has traditionally consisted of a lamination of several sheets of organic materials, such as FR-4 epoxy. FR-4 layers are typically between 1 and 3 mils (25-75 µms) thick. The laminate is traditionally drilled using conventional mechanical drilling. One drawback of this technique is that the holes end up at the same locations in all the layers, which wastes board space and prevents the achievement of high density. Further, the different layers of the assembly must have individual hole patterns because the signal routing requirements change from layer to layer. This can be accomplished by drilling the FR-4 layers separately with laser prior to lamination. However, this technique also yields low density because it is difficult to maintain a high degree of alignment between the holes during the lamination process.

Another substrate fabrication technique, which is used widely with ceramic substrates, is the build up process. Starting with a rigid ceramic wafer, successive dielectric and metallic layers are added using thick film technology. Each layer is patterned to create either horizontal metal traces or drilled vertical vias. A thick ceramic paste with metal fillers, such as Fodel manufactured by DuPont, is driven into the tiny holes using a process similar to screen-printing. The substrate is subsequently co-fired at very high temperature to sinter the material. The drawback of the build up process is that the successive layers take the shape of the layers underneath with the resulting loss of planarity and registration accuracy, hence density.

In order to increase the density of the interconnect it is necessary to fabricate smaller diameter holes and to pack them closer together. However, the challenge is not drilling smaller holes. Holes smaller than 50 µm are drilled routinely with laser. The challenge has been coating them with metal to ensure reliable electrical connection between both sides of the substrate. Getting the walls of the tiny holes to wet for the metal to stick to it has proved to be challenging. There are two main parameters, which play a vital role in determining the success of the metallization, namely the diameter of the hole and its aspect ratio, i.e. the ratio of the depth of the hole to its diameter. The current limitation in hole diameter is about 100 µms and the highest aspect ratio that can be successfully coated is about 1:1 or even less.

A seed layer is a precursor for growing a metallic layer on any surface. However, the chemical processes responsible for seeding thin metallic films on flat surfaces are totally different from those that are used to coat vertical cylindrical walls of tiny holes. For example, dry coating techniques such as sputtering and thermal evaporation yield excellent film coverage on flat surfaces but cannot coat narrow holes, particularly those with high aspect ratios. A wet technique, which is widely used in the semi-conductor packaging industry for metallizing 100 µm vias in rigid FR-4 boards, is electroless copper plating. However, electroless plating cannot be used to coat 50 µm or smaller vias because it releases hydrogen bubbles of about the same diameter, which get trapped in the holes and block the plating process. In the case of ceramic substrates the thick Fodel paste cannot penetrate a 50-µm hole. For these reasons, the smallest hole diameter that can be successfully coated in either material is currently limited to about 100 µms; and the pitch, i.e. center-to-center between holes or pads is limited to about 200 µms. Furthermore, it is desired to eliminate the adhesive layer between successive layers of a multi-layered substrate. The use of adhesive layers, such as Pyralux manufactured by DuPont, increase the complexity of the assembly and can become the bottleneck limiting the speed and density of the interconnect.

It is estimated that in the near future about 50% of all silicon wafers and chips will be thinned to make way for 3-D electronics and for better heat dissipation. High performance silicon devices will be stacked to provide high-density circuits. Each silicon layer must be thinned to below 100 microns to meet certain total thickness requirements for mobile and handheld devices. It is also desired to fabricate high performance single crystal silicon devices on flexible substrates for high-density displays and smart cards. The silicon wafers are thinned and diced after fabrication of the devices.

The handling and packaging of thinned silicon wafers and chips presents a major problem due to breakage of the thin wafers, which reduce the yield dramatically. The back-end-of-the-line (BEOL) industry does not have a viable solution for this problem.

It is desired to thin silicon for various applications. Silicon membranes, only a few microns thick, are very flexible and commercially available, albeit very expensive. High performance electronic devices are fabricated using high temperature CMOS processes on standard thickness silicon wafers. The silicon wafers are thinned and diced after fabrication of the devices. Silicon wafers have been thinned down to 20 microns. Many applications require through-wafer via drilling, plating and metallization of the backside of the thinned wafers or chips for interconnection to other devices. This also requires the deposition of solder bumps, which can be even thicker than the wafer. The packaging industry faces a serious problem in handling of thin wafers during processing due to brittleness and fragility of thin silicon. Even if the thin silicon device survives the processing, the final packaging presents additional risks of breakage and further reduction of yield. Thin silicon wafers are not inexpensive. For example, a 100 mm diameter membrane 10 µm thick costs as much as $ 300. 200 mm diameter wafers have been thinned down to 50 µms at very high cost. Even though these wafers are flexible, but they are delicate, fragile and break easily if not handled properly. Processing of wafers after thinning should be avoided as much as possible. Thin silicon wafers and dies require special handling and extreme care, which add cost. It is also desirable to use existing automated robotic handling equipment to handle the majority of wafers.

The most common technique for thinning is back grinding. The silicon wafer is mounted on a supporting carrier, which must withstand the grinding and further processing. The carrier must attach to the wafer firmly and then detach easily after thinning for packaging. Currently most of the effort in the industry is focused on (temporary) handling rather than (permanent) packaging.

The industry is searching for a solution for handling thin wafers throughout the production cycle. All existing solutions are extremely difficult to implement and introduce very high risk of wafer breakage. Equipment and materials suppliers are considering various approaches. Most handling techniques currently being investigated cannot survive all the processing steps.

Several companies are using polymeric tapes made of soft material with Kapton backing. The tape is inexpensive and can effectively support the wafer during grinding but cannot withstand high temperatures encountered during other processing, such as backside metallization. Variations in the thickness of the tape translate directly into thickness variations (TTV) of the thinned wafer. The risk of breakage increases drastically during demounting especially for wafers below 80 μms. Further, the tape is incompatible with standard automated tools because it does not provide a rigid support.

Silicon and glass wafers have been used as temporary carriers of thinned silicon wafers using reversible bonding, i.e. held by wax. The silicon and glass wafers provide rigid support compatible with automated handling but the risk of breakage during de-waxing is still very high. Alternatively, the wafer can be held electrostatically on a chuck, but this solution is expensive and not useful for ultra-thin grinding due to insufficient shear strength. Further, it is incompatible with subsequent processing steps such as etching or elevated temperatures due to dissipation of the charges.

The most critical step for the success of thinning is the choice of glue between the wafer being thinned and the carrier substrate, which depends on whether the bond is temporary or permanent. For temporary handling applications, the glue must be strong enough to provide sufficient shear strength during grinding but also must dissolve easily without leaving any residue. The risk of breakage during de-bonding and cleaning is very high. Most glues can be dissolved either with acetone or by heating. Acetone dissolution is limited by peripheral access, thus requiring die level bonding or the use of a perforated carrier. Sliding the thin wafer at temperatures above the flow point of the glue and subsequent acetone cleaning poses extra risks of breakage. The glue must survive all processing steps including vacuum and high temperature backside metallization and then dissolve without leaving a trace. These are tough requirements. Organic adhesives (epoxies) leave residues. For this reason, the temporary attachment issues are not trivial. The industry does not have a viable solution.

Finding the right method of support during thinning has been a major challenge for the industry. For this reason the majority of the effort is currently directed toward solving the temporary handling problem rather than the long-term packaging issues. The high risk of breakage is due to the need to de-bond the thin wafer after grinding. There is currently no suitable substrate, which supports the silicon wafer during thinning and acts as a permanent carrier.

Thin-film transistors and memory cells have been deposited directly onto flexible substrates. These flexible circuits consist mainly of low density interconnects and low performance devices. This technique is alternative to thinning of chips and mounting on flexible substrates. The main drive is the fabrication of large area electronics, which can be printed while rolled from reel to reel, and for flexible solar panels. The emphasis is on low cost. The films are deposited at relatively low temperatures compatible with the flexible materials. This yields amorphous or poly-crystalline silicon devices.

The drawbacks of polysilicon circuits are that they are too slow due to the gate material being non silicon-oxide. This causes poor performance due to decreased carrier mobility. These devices are fabricated at temperatures, which do not exceed 200° C.-300° C. Growing good gate oxide for high performance MOSFETs, for example, requires temperatures of at least 800° C. Polymeric flexible materials cannot withstand such temperatures. Further, fabs and foundries are reluctant to introduce polymer-based substrates in their MOS lines due to contamination issues. Large area circuits are fabricated using inkjet-printing technology, which yield coarse resolution. For these reasons large area flexible circuits fabricated on sheet or roll are bound to low performance devices.

There is a desire in the industry to fabricate single crystal silicon devices and circuits on flexible substrates. Polymeric films, such as PDMS, have been spun on silicon-on-insulator (SOI) wafers and bare silicon strips, 300 nm thick, were transferred to the PDMS substrate by etching the buried oxide layer with HF. Low performance transistors were fabricated in the single-crystal silicon strips after the transfer. This research was published in the journal "Science" in January 2006.

Silicon dies about 5 mm×5 mm have been thinned down to 20 μms, metallized with about 6-8 μms of copper and flip chip mounted on spun-on polyimide films also 20 μms thick, with significant stress and yield issues. However, high performance single crystal silicon devices and circuit layers have not been transferred to flexible substrates.

Current industrial efforts promote the use of large area electronics in panel or sheet format or rolls from reel-to-reel. These circuits will consist mainly of interconnects for low density display applications or for solar panels.

It is desired to make solar systems as light and efficient as possible especially for space applications. The highest efficiencies to date of 30%, and more recently 40%, have been achieved in multijunction single-crystal solar cells fabricated in III-V semiconductor compounds. The cells are up to 10 microns thick and are epitaxially grown on germanium (Ge) or gallium arsenide (GaAs) substrates, which are rigid and require heavy support structures. Thinning of the semiconductor wafer reduces the weight but makes it brittle. To date there has not been a suitable flexible substrate that protects the fragile thin cell and serves as a permanent carrier, which is scaleable to large panels.

There are three types of solar cells: thin films, which are usually polymeric or amorphous silicon and which can be deposited on large panels a few square meters in size made of glass substrates or flexible plastic sheets using roll-to-roll manufacturing processes. These films are fabricated at low temperatures compatible with the flexible substrates and have efficiencies below 10%. Other more efficient materials, such as copper indium gallium selenide (CIGS) or cadmium telluride (CdTe), which is a polycrystalline II-VI compound, have also been used to fabricate the thin-film solar cells. The use of thin-film photovoltaic cells could lead to a reduction in the cost of solar panels but would require larger areas due to the low efficiencies of the cells. The second type of solar cells are single or poly-crystalline silicon grown on silicon wafers, and contain indium, which is a rare and expensive metal that contributes to the high cost of solar panels. These cells achieve efficiencies between 15 and 20%. The vast majority of solar panels in use today are based on silicon cells. The third type of solar cells with the highest efficiency are made of III-V semiconductor compounds and fabricated on GaAs or Ge wafers. Recent advances in III-V multijunction solar cell design have resulted in a metamorphic lattice mismatched GaInP/GaInAs/Ge 3-junction cell with 40.7% efficiency. These cells are fabricated on their native substrates at very high temperatures and have attained efficiencies over 40%, double the efficiency of conventional silicon solar cells. The total thickness of the three junctions is about 10 microns. Two such cells typically share a 4" Ge wafer for space applications. Cells that are designed for terrestrial use have smaller areas of about 1 mm$^2$ and are used in conjunction with concentrators that focus the solar radiation.

Unlike silicon solar cells, which utilize a single junction, the multijunction technique features three stacked photovoltaic (PV) layers each with different bandgap energy. Light across a broader spectrum is captured and converted into electricity. The cell consists of GaInP (for short wavelengths), GaInAs (middle part of spectrum), and Ge for capturing IR. The breakthrough efficiency was the result of the lattice mismatch. These multijunction solar cells were developed primarily for powering spacecraft but are starting to appear in terrestrial applications. Currently, cells with 4 junctions are being experimented. Concentrator solar cells with efficiencies of 36% are currently being mass-produced and shipped and plans for producing cells with efficiencies of 42% by 2010 are underway.

It is contemplated to use the highest efficiency cells for space applications to power satellites in order to reduce the weight at lift-off. The ultimate goal of solar cell fabrication is flexibility and scalability because large areas are required to capture sufficient solar radiation to generate substantive electrical power. It would be necessary to thin the Ge or GaAs wafer to make it lightweight and flexible. The key factor is not the substrate weight or thickness, but the implications on module design and packaging. Thick wafers are brittle and need protection from mechanical stress, hence the heavy support structures. The Holy Grail of solar panels is a module that can be bent and still functions. This precludes the use of thick glass front plate on the solar panel.

Ge wafers carrying multijunction solar cells have been glued to Kapton tape up to a few mils thick using materials such as Teflon. The single crystal cells were thinned either by grinding away the Ge base or by incorporating sacrificial layers, which were subsequently etched to lift-off the thin cells. The Kapton serves as a temporary carrier for handling the thin layers. The lightness and flexibility of the Kapton allows reaching specific powers in excess of 1000 W/kg, but the problem with Kapton is its lack of stability at high temperatures and the variation of its thermal properties with temperature. For example, the coefficient of thermal expansion (CTE) of Kapton, according to the manufacturer's spec sheet, jumps from 18 ppm/° C. between 23 and 100° C., to 31 ppm/° C. between 100 and 200° C., to 48 ppm/° C. between 200 and 300° C., up to 78 ppm/° C. between 300 and 400° C. This wide variation causes uneven expansion and stress in the thin films at high temperatures. High temperature properties of the carrier are important because the thin cell is further processed for backside metallization after lift off. Kapton does not have the quality to serve as a permanent carrier.

The technique of layer transfer by bonding and subsequent thinning of the wafer was developed in conjunction with 3-D circuit integration and SOI technology. For example, a high performance circuit is fabricated on an SOI wafer. The SOI layer may include silicon device islands as small as 5 µm×5 µm×100 nm buried under silicon oxide layers and connected by metallic lines with a total thickness of up to a few microns. The SOI wafer is temporarily bonded to an intermediary or handle wafer using dissolvable epoxy. The handle wafer is usually made of glass, which permits visual alignment of the wafers. The SOI wafer is thinned by a combination of back-grinding and etching. The buried oxide of the SOI serves as the etch stop layer. After thinning, the thin SOI layer with devices sits upside down on the handle wafer. Subsequently, the glass wafer with the inverted circuit is bonded to the host wafer using permanent adhesive, such as BCB. The host wafer is usually a silicon wafer. The epoxy between the glass wafer and the SOI layer is dissolved during the BCB curing process, thus freeing the handle wafer to be reused. Alternatively, the epoxy layer can be ablated with laser through the glass wafer. After the second transfer the SOI circuit layer faces upwards on the host wafer. The entire procedure is repeated to build 3-D circuits on the host wafer. Vias with cross-sections less than 10 µm×10 µm are dry etched in the successive layers and metallized to provide vertical interconnects among the layers. This also provides multi-gate access. The SOI devices can be ultra-thin, less than 50 nm. The entire SOI layer including all silicon devices, metal and oxide layers could be less than 1 µm thick. This is the standard procedure for stacking silicon circuit layers by lifting off the SOI layer. This procedure is similar to the fabrication of bare SOI wafers except that the layer is transferred after the circuit is fabricated. The thinning procedure is also used to provide efficient means of heat dissipation for high-speed high performance devices made of III-V compounds. This procedure sacrifices the original donor wafer. Alternatively, sacrificial layers can be incorporated in the Ge or GaAs wafer, which permit lift-off of the thin epi-layer and reuse of the donor wafer. The handle and host wafers provide continuous support for the thin layer throughout the thinning process. This is safer than thinning of silicon chips by mounting temporarily on tapes and circumvents the risks associated with handling the thin layer. The lift-off process described above is less risky because the thin layer is continuously supported. IBM demonstrated successful transfer of pre-fabricated single crystal silicon circuit layer to silicon host substrate in 2003.

High performance single crystal silicon devices and circuit layers have not been transferred to flexible substrates. Epitaxially-grown multi-junction solar cells on Ge and GaAs substrates have not been transferred to flexible substrates.

It would therefore be desirable to provide a flexible polyimide substrate and a polymer laminate wherein the materials used for the different layers are highly compatible in terms of thermal, mechanical, chemical and machining properties.

It would also be desirable to cost-effectively fabricate, for example, by laser machining in a polymer or a polymer laminate a micro-structure, for example, a cantilevered waveguide.

It would also be desirable to fabricate an opto-mechanical device, such as an accelerometer or optical switch incorporating a micromachined cantilevered waveguide.

It would also be desirable to fabricate a micro-mechanical device in a flexible polyimide substrate, which can be actuated with low electrical power.

It would also be desirable to couple light efficiently and passively between a single mode fiber and a single mode waveguide.

It would be desirable to provide a multi-layered polyimide substrate with a three-dimensional high density interconnect consisting of holes less than or equal to 50 µm diameter and pitch less than or equal to 100 µms, and to eliminate the adhesive layers between successive layers of the substrate.

It would be desirable to provide a silicon wafer bonded to a polyimide substrate.

It would be desirable to provide a thin silicon layer bonded to a polyimide substrate.

It would also be desirable to provide a thin silicon layer with a circuit bonded to a polyimide substrate.

It would be desirable to provide a Ge or GaAs wafer bonded to a polyimide substrate.

It would be desirable to provide a thin Ge or GaAs layer bonded to a polyimide substrate.

It would also be desirable to provide a thin epitaxially grown Ge or GaAs layer with a solar cell bonded to a polyimide substrate.

SUMMARY OF THE INVENTION

This invention is directed to polyimide substrates for optical applications, and to laminates and stacks of wafers fabricated using the polyimide substrates.

According to one aspect of the invention, a polyimide substrate has one or two polished sides with a surface roughness between about 0.25 μinch and about 100 μinch. A polymer waveguide layer can be disposed on a polished side of the polyimide substrate, with the polymer waveguide layer having a refractive index that is greater than a refractive index of the polyimide substrate and a thickness so as to support at least one guided mode in the polymer waveguide layer. A first polymer cladding layer can be disposed between the polyimide substrate and the polymer waveguide layer, with the first polymer cladding layer having a refractive index that is smaller than the refractive index of the polymer waveguide layer. A second polymer cladding layer can be disposed on top of the polymer waveguide layer, with the second polymer cladding layer having a refractive index that is smaller than the refractive index of the polymer waveguide layer.

According to another aspect of the invention, a laminate has at least a polyimide substrate and a polymer, or a polyimide or a hybrid organic/inorganic film deposited on the substrate.

According to another aspect of the invention, the laminate can also include a ceramic layer, preferably a piezoelectric layer, such as PZT or PLZT, AlN, or ZnO on a polyimide substrate.

According to another aspect of the invention, the laminate can also include metallic layers on a polyimide substrate.

According to another aspect of the invention, the laminate can include a polycrystalline copper-indium-gallium-diselenide (CIGS) or a cadmium telluride (CdTe) film on a polyimide substrate.

According to another aspect of the invention, a method is disclosed for forming a polymer waveguide structure on a polymer substrate. A first shape of the optical device is defined in the polymer waveguide structure using a first laser beam emitting in the IR spectral range, and a second shape of the optical device is defined in the polymer waveguide structure using a second laser beam emitting in the UV spectral range. The first laser beam separates the polymer waveguide structure at least partially from the polymer substrate. The second laser beam produces a gap between the at least partially separated polymer waveguide structure and a remaining portion of the polymer waveguide so as to form a cantilevered waveguide structure. The end face of the cantilevered waveguide structure facing the gap may be perpendicular or inclined with respect to a surface normal of the polymer substrate.

In one embodiment, the first laser beam impinges in a first area on a backside of the polymer substrate opposite the polymer waveguide structure, causing ablation of the polymer substrate in the first area without ablating the polymer waveguide structure. The second laser beam impinges on the polymer waveguide structure in a second area overlapping with, but smaller than the first area, causing ablation of the polymer waveguide structure and forming an air gap, thereby releasing the cantilever. The released cantilever can pivot about a fixed end located opposite the air gap.

According to yet another embodiment of the invention a method is disclosed for forming a groove in a polymer laminate which includes an optical waveguide on a polyimide substrate for coupling light to an optical fiber. The method includes ablating a groove in the polyimide substrate substantially collinear with the optical waveguide. The groove has a bottom so that a center of the optical fiber inserted in the groove and contacting the bottom is substantially coincident with the center of the optical waveguide in a direction normal to the surface. The sidewalls of the groove are ablated smooth and vertical by adjusting the ablation parameters of the excimer laser and the design of the optical delivery system, to securely hold the optical fiber in the groove.

According to another aspect of the invention, a polyimide substrate has holes drilled with laser and metallized to provide continuous electrical contact between both sides of the substrate.

According to another aspect of the invention, the holes have diameter less than or equal to 50 μm diameter and pitch less than or equal to 100 μms.

According to another aspect of the invention, at least two polyimide substrates are stacked to provide multi-level interconnect.

According to another aspect of the invention, stacks of polyimide substrates are attached using electrically conductive bumps.

According to another aspect of the invention, a semiconductor wafer, such as silicon or germanium or gallium arsenide is bonded to a polyimide substrate.

According to another aspect of the invention, a semiconductor wafer carrying devices and circuits is bonded to a polyimide substrate.

According to another aspect of the invention, the composite structure consisting of the semiconductor wafer, glue and polyimide substrate is thinned by grinding and lapping.

According to another aspect of the invention, polyimide substrates carrying high-density circuits or high efficiency solar cells are patched onto large format sheets or panels.

BRIEF DESCRIPTION OF THE DRAWINGS

The accompanying drawings are not intended to be drawn to scale. In the drawings Each identical or nearly identical component that is illustrated in various figures is represented by a like numeral. For purposes of clarity not every component may be labeled in every drawing. In the drawings.

DETAILED DESCRIPTION OF CERTAIN ILLUSTRATED EMBODIMENTS

Figure 1A:
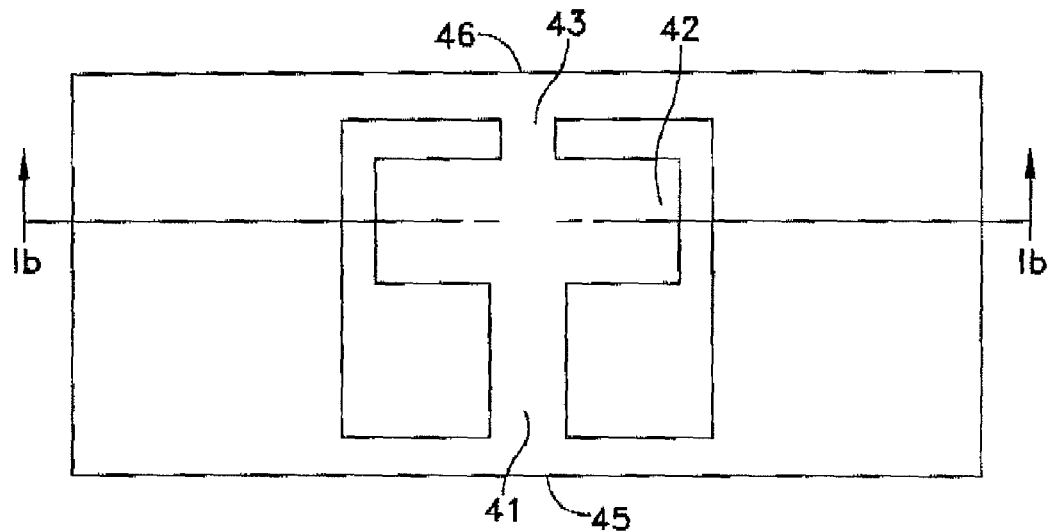
FIG. 1a shows schematically a top view of a cantilever structure before release, machined in a VESPEL® substrate using a $CO_2$ laser.

This invention is not limited in its applications to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including", "comprising", or "having", "containing", "involving", and various thereof herein is meant to encompass the items listed thereafter and equivalents thereof as well as additional items.

This invention provides materials and methods suitable for fabrication of a laminate comprising a waveguide and a polymer structure disposed on a flexible polyimide substrate. The invention also provides a micromachined cantilever supporting an optical waveguide, as well as a laser micromachining process, which allows fabrication of the desired waveguide end face inclination by directing an ablating laser beam onto the polyimide substrate at a predetermined angle with respect to a normal to the surface of the substrate. The combination of materials disclosed herein achieves advantageous optical, mechanical, processing and thermal properties.

This invention uses laser micromachining for the fabrication of micro-electro-mechanical systems (MEMS) and opto-micro-electro-mechanical systems (OMEMS), as a replacement for chemical or physical etching. This process is cost-effective and avoids wet or dry etching in the fabrication of microstructures.

Polyimide substrates suitable for use in this invention are flexible with a modulus of elasticity ranging between 1 and 10 GPa. These polyimide substrates are generally at least 150 µm thick, but thinner substrates can be used. The polyimide material can preferably withstand temperatures such as those encountered in cutting and polishing without significant degradation of the physical and mechanical properties. The surface of the polyimide material can be polished to achieve a surface roughness in the range between about 0.025 µinch and about 100 µinch. VESPEL® is a suitable polyimide material commercially available from DuPont, which can be machined into a suitable substrate and which can operate continuously from cryogenic temperatures up to 288° C. in air, to 315° C. in inert environments or vacuum, and can withstand temperatures up to 482° C. intermittently. It is tough yet compliant, which makes it suitable for a flexible substrate. Because of its inherent mechanical strength, stiffness and dimensional stability at machining temperatures, VESPEL® can be machined with the use of standard metalworking equipment. It can also be ground, buffed, lapped and polished. VESPEL® has a dielectric constant of 3.4.

VESPEL® is a mechanically sturdy, visually opaque, brown colored polyimide which is available commercially in the form of circular discs with diameters varying between about 2 inch and about 19 inch, and thickness between about 0.25 inch and about 4 inch. It is also available in blocks up to 2 inch thick and up to 13 inch wide, which can be machined into plates or cylinders. These disks are too thick to be used as wafers. In the present invention VESPEL® polyimide is cut from bulk cylinders, preferably with a wire saw to form thin substrates. The VESPEL® substrates are polished to form wafers on which films are deposited. VESPEL® wafers of any thickness are obtained by cutting and polishing the VESPEL® discs. VESPEL® wafers with the desired final thickness can also be directly formed by molding to a thickness close to the final thickness and polishing the surface without the need for cutting from a thicker disc. The thickness of the wafer can vary along the radius. For example, the inner portion around the center of the wafer can be thin as a membrane while the outer portion near the perimeter of the wafer can be thicker as a ring, or vice versa. VESPEL® polyimide is also available in other forms, such as rods, plates, plaques, and bars, which can be used to form substrates. VESPEL® bulk forms which are made from either SP, SCP or ST polyimide resins can be used to form substrates useful for this invention. The SCP resin has a water absorption coefficient of about 0.08% by weight in a 100% relative humidity environment. VESPEL® with fillers such as 15% or 40% graphite, and 10% Teflon can also be used to form substrates useful for this invention. VESPEL® has a coefficient of thermal expansion varying between 20 and 54 ppm/° C., preferably in the range 40 to 54 ppm/° C. Polyimides other than VESPEL® but with similar properties, such as Meldin®, are also suitable for making substrates. Thermoplastic polyimides can be used to make polished wafers if a certain predetermined temperature known to cause the thermoplastic to flow is not reached during the cutting, polishing and subsequent operation of the wafer. Thermoplastic polyimide wafers with near final dimensions can be injection molded and then polished. It is preferred to use thermoset or thermoset-like behaving polyimides to polish wafers suitable for this invention.

Polyimide discs with diameters varying between about 2 inch and about 6 inch and thickness varying between about 0.25 inch and about 4 inch were sliced to form thin wafers with thickness varying between about 500 µm and about 1.25 mm. The wafers were subsequently polished on either one or both sides to an average surface roughness of about 0.25 µinch. The polished wafer thickness was about 200 µm, 500 µm, 625 µm, 750 µm, 875 µm, 900 µm, and 1 mm. This yielded flat polyimide wafers with uniform thickness and highly reflective surfaces ready for film deposition. Alternatively, polyimide wafers can be ground using a diamond wheel. Polishing of the polyimide surface improved the reflectivity significantly. Polyimide wafers can be polished to an average surface roughness of 0.025 µinch with the use of chemical mechanical polishing (CMP). A polished polyimide wafer can be bonded to a silicon wafer.

Laminate structures can be deposited on polyimide substrates. The laminate can consist of one or more films or layers. Suitable laminate materials are polymers, polyimides, hybrid organic/inorganic compounds, metals, ceramics, and piezoelectrics. Polymeric films that can be deposited on polyimide substrates include acrylates, polyimides, polycarbonates, cyclobutanes, polyetheremide, SU-8, and PDMS. Suitable waveguide materials that can be deposited on polyimide substrates are perfluorinated polymers, such as perfluorocyclobutane (PFCB); halogenated acrylates, such as PMMA; fluorinated and non-fluorinated polyimides; and hybrid organic/inorganic compounds, such as silicate-based spin-on glasses that are deposited using the solgel process. Fluorinated polymers contain the C—F molecule, which is known to produce low optical losses in the NIR region of the spectrum.

Laminate waveguide structures were deposited on VESPEL® substrates using organic materials, in particular polyimide films, with a glass transition temperature greater than 200° C., and having a thickness between 0.1 µm and 15 µm. Multi-layer films can be deposited. These polyimide films were spun cast from solutions directly on the VESPEL® substrate. In some cases an adhesion promoter layer was used between the polyimide film and the polyimide substrate. Other deposition methods include, for example, dipping, spraying, coating, or gluing. Polymeric waveguides can be obtained as freestanding films, which can be glued onto the polyimide substrate. Channel waveguides can be fabricated in polymeric films by wet or dry etching. Channel waveguides can also be fabricated in photosensitive polymeric films through development. Photosensitivity in polymeric films can be obtained through the inclusion of dopants, such as alkylated groups or chromophores. Upon exposure to UV light, the dopant cross-links to the polymer matrix, thereby changing the index. A channel waveguide having a desired cross-section can be fabricated in photosensitive polymers without etching or material removal by doping in an amount sufficient to achieve a controlled increase in index in the core region relative to the surrounding regions upon exposure to UV light.

Polyguide™ films, manufactured by DuPont in Wilmington, Del., contain low molecular weight acrylate and methacrylate monomers. These monomers diffuse within a polymer binder matrix and polymerize when exposed to UV light thereby changing the index of refraction of the polymer. Waveguides and in particular single mode waveguides are fabricated by photochemical polymerization of the monomers with the use of laser writing or photolithography. Channel waveguides can be fabricated in Polyguide sheets, without etching or material removal, by exposing it selectively through a mask to UV radiation. Several meters long single or multimode waveguides can be fabricated in Polyguide polymer sheets or rolls. Freestanding polyguide sheets can then be cut and glued onto polyimide substrates.

A laminate has at least a polyimide substrate and a hybrid organic/inorganic waveguiding film based on an Si—O—Si backbone deposited on the substrate using the solgel process. The organic/inorganic hybrid can be fluorinated. These hybrid materials have a coefficient of thermal expansion varying between 50 and 250 ppm/° C. An optional optical buffer layer can be used between the wave guiding film and the polyimide substrate, and an optional upper cladding layer can be deposited on top of the wave guiding film. Each layer has a thickness in the range specified above. The laminate demonstrates compatibility of the mechanical, thermal, chemical and optical properties of all the layers and specifically closeness of the coefficients of thermal expansion of the layers in the laminate, which minimizes residual stresses. The coefficients of thermal expansion of the laminate are preferably in the range between 20 and 75 ppm/° C. The deformation and warpage of the laminate and the delamination and/or cracking of the film are thus reduced when subjected to baking cycles. A wave guiding laminate can exhibit minimal stresses and birefringence because the coefficient of thermal expansion of the polyimide substrate is about 50 ppm/° C. close to that of isotropic polymeric films.

An athermal design of an optical device can be achieved by using a wave guiding film material, such as fluorinated acrylates, whose thermo-optic coefficient is approximately equal to negative of the product of the index of the film and the CTE of the polyimide substrate. Reduced thermal sensitivity can be achieved by using a wave guiding film whose thermo-optic coefficient is close to the negative of the product of the index of the film and the CTE of the polyimide substrate. The optical device can be tuned mechanically with the use of a MEMS structure, such as a cantilever, without disturbing its athermal behavior, and without the need for temperature control, because MEMS actuation dissipates very little electrical power, on the order of µwatts. A displacement of the cantilever causes a change in the intensity or length of the optical path of the light passing through the waveguide.

The laminate can also include metallic films, such as aluminum (Al), copper (Cu), gold (Au), silver (Ag), titanium (Ti), nickel (Ni), platinum (Pt), molybdenum (Mo), chromium (Cr) on a polished polyimide substrate. The metallic layers can be deposited either by sputtering, evaporation, electroplating or electroless plating. Several metallic films were deposited on polished VESPEL® substrates by sputtering and by evaporation. The films adhered well to the polished VESPEL® substrates. The VESPEL® substrates did not outgass an amount sufficient to contaminate the sputtering ovens. A laminate can include one or more metallic films that exhibit low loss at RF and millimeter wave frequencies disposed on a polished polyimide substrate.

The laminate can also include a ceramic layer, preferably a piezoelectric layer, such as PZT or PLZT, AlN or ZnO on a polyimide substrate. A first metallic layer, preferably platinum, is disposed on a polyimide substrate. A piezoelectric layer, preferably PZT, is deposited on the first metallic layer. A second metallic layer is deposited on top of the piezoelectric layer. PZT can be deposited using the solgel process. The two metallic layers serve as electrodes. A voltage is applied across the electrodes, which causes a lateral displacement of the piezoelectric film through the piezoelectric coefficient $d_{31}$. The flexibility of the polyimide substrate allows the thin piezoelectric layer to bend the substrate with reasonable applied voltages that are compatible with commonly available driving circuits. This allows a MEMS structure, such as a micromachined cantilever, which can be as thick as the substrate itself, to be actuated by a thin piezoelectric layer deposited on top of the polyimide substrate. The piezoelectric layer can be deposited between the polished polyimide substrate and the wave guiding film, or it can be deposited on top of the wave-guiding film. The metallic and ceramic films can be patterned by laser ablation, which eliminates the problems associated with selectivity of wet or dry etching among the layers.

The back side of a VESPEL® wafer can be polished. Polymeric, polyimide, hybrid organic/inorganic, metallic, and piezoelectric laminates can be deposited on the polished backside of a VESPEL® wafer. Deposition of similar laminates on both sides of a VESPEL® wafer preserves the symmetry and reduces the tendency for warpage.

A micromachined cantilever is fabricated in a polyimide substrate. A laminate consisting of a first metallic layer, a piezoelectric film, and a second metallic layer is deposited on the polished polyimide substrate. The laminate is ablated along a neutral axis of the cantilever to create two electrically isolated sections of the laminate, a left section and a right section, which can be driven independently. The two sections can have a common electrical ground. When the sections are driven with different voltages unequal strains develop in the left and right portions of the cantilever, which cause the cantilever to displace in a direction parallel to a surface of the substrate.

The laminate can include a polycrystalline copper-indium-gallium-diselenide (CIGS) or a cadmium telluride (CdTe) film on a polyimide substrate.

It is necessary to prepare the input and output end faces of wave guiding films on polyimide substrates to couple light in and out of the waveguide, and to prepare the air gap between a cantilevered waveguide and a fixed waveguide. The input and output end faces can be cut, for example by dicing with a diamond blade, or ablated with an excimer laser. The dicing technique can be more cost-effective for preparing the input/output edges of the film. The narrow air gap of only a few microns between two waveguide end faces is fabricated by laser ablation.

For the preparation of optical quality input and output waveguide edges at air/film interfaces, a light source whose spot size can be focused to less than about 10 µm, such as an excimer laser is used. This yields smooth edges, which reduce scattering of the light. Polymer materials absorb at UV wavelengths, therefore any laser or light source which emits in the UV, or whose frequency can be doubled or tripled or quadrupled to yield a wavelength in the UV range between 180 nm and 400 nm, and whose spot size can be focused to less than about 10 µm can be used. However, for the preparation of the edges of films that are not crossed by light, or for the fabrication of coarse contours of MEMS structures, or for etching blind or via holes through the substrate, an IR laser, such as a $CO_2$ or YAG laser that etch polymer materials faster than the excimer laser, can be used. The quality of the IR laser cut can be improved with the use of a short pulse high-energy laser such as a Q-switched $CO_2$ laser. The air gap walls and input/output edges of wave guiding films can be ablated smooth and planar by adjusting the intensity profile and parameters of ablation of the excimer laser. The ablated film edges are slightly tapered at a half-angle of about 0.75° to the vertical. The taper angle depends on the design of the optical delivery system. The etch rate and quantity of debris released by ablation depend on the fluence of the laser and the pulse repetition rate. These parameters are optimized to yield controllable etch rate while minimizing the effect of debris on the wave guiding film. The attachment of the debris to the film can be reduced with the use of sacrificial coatings.

EXAMPLE 1

Air Gap Ablated with Excimer Laser

Air gaps of widths 3, 5, 7 and 10 µms were ablated in a polyimide film, about 4 µm thick, disposed on a polished VESPEL® wafer with a Lambda Physik ArF laser emitting at 193 nm. The laser was pulsed at the rate of 40 Hz and had an energy density of 5.679 $J/cm^2$. The fluence, repetition rate, pulse width and total number of pulses can be controlled with a computer. The laser beam was homogenized with a lens array, which overlaps four beams to provide a single image with a square-top intensity profile. The wafer was mounted on a computerized translation stage and scanned in its plane during the ablation to create air gaps of different lengths. The laser beam was directed either normal to the surface of the wafer or inclined by an angle of 30° relative to the normal to ablate vertical or inclined air gaps, respectively. The sidewalls obtained with laser ablation were smooth and planar. The fluence and pulse repetition rate of the excimer laser influence the quantity of debris released by the ablation.

A polyimide wafer carrying a film can be cut into many pieces by dicing with a diamond blade, or cutting with a laser such as $CO_2$ or YAG, or excimer laser. The blade and $CO_2$ laser separate the wafer. The depth of the cut can be controlled more precisely with the excimer laser. In order to separate a wafer it is not necessary to ablate through the thickness of the wafer with the excimer laser. It is often sufficient and more economical to ablate through the film and to continue the ablation to a certain depth, for example about 100 µm into the polyimide wafer. Structural weakening of the wafer along the scribing line allows cleaving of a polyimide wafer in a manner similar to a silicon wafer. Cleaving by hand is a simple and cost-effective method of breaking a laminate into many pieces.

A deep vertical step was ablated in a VESPEL® wafer near the edge of a polymer film with an excimer laser. The depth of the step necessary to clear the path of the light depends on the numerical aperture of the focusing optics. A depth of about 100 µm is sufficient to clear the path of the focused light butt-coupled to the input edge of the waveguide. A VESPEL® wafer was cleaved first by scribing with an excimer laser and then breaking by hand. This procedure for separating a VESPEL® wafer avoids lifting the film off the edge of the substrate. The quality of the ablated edge of the film was sufficient to couple light into the wave guide without further smoothening of the edge.

To fabricate a structure, such as a cantilever, a polyimide wafer is cut, preferably using a pulsed $CO_2$ laser. A cantilever can also be fabricated using an excimer laser. The pulse width of the $CO_2$ laser is about 0.5 ms. The $CO_2$ laser is controlled with a computer, which stores AutoCad data representing the contour of the cantilever. The cantilever contour was cut in a single traversal of the wafer by the $CO_2$ laser beam. The minimum spot size achievable with a $CO_2$ laser is typically at least about 50 µm, which tends to produce ragged edges in the waveguide film and the micromachined cantilever. Smoother edges can be obtained with the use of a Q-switched $CO_2$ or excimer laser.

Most of the contour of the cantilever is fabricated with the $CO_2$ laser, except for a narrow region at the location where the air gap is subsequently formed with an excimer laser. The $CO_2$ laser does not separate the cantilever completely from the wafer but keeps it suspended at the narrow region. The narrow region in the VESPEL® wafer was ablated with excimer laser concurrently with the formation of the air gap. Ablation of the air gap in the organic film and concurrent ablation of the VESPEL® material underneath it releases the cantilever, which then can freely move due to acceleration or applied force.

Debris produced by $CO_2$ laser cutting can deposit on the laminate and interfere with its wave guiding properties. This can be prevented by flipping the VESPEL® wafer upside down, so that the $CO_2$ laser beam impinges on the uncoated back surface of the VESPEL® wafer. In this way, the $CO_2$ laser beam cuts through the bulk of the VESPEL® wafer first before reaching the waveguide film. Any remaining debris, which deposit on the waveguide end faces can subsequently be removed by excimer laser ablation. It is preferred that the step of $CO_2$ laser cutting precede the dicing and excimer laser ablation steps. It is also preferred that the last step in the fabrication process be the excimer ablation step.

The procedure for releasing the cantilever and forming the air gap utilizes two consecutive steps:

(i) ablating from the uncoated back surface of the VESPEL® wafer to a depth short of ablating through the whole wafer and a width larger than the desired width of the air gap, and (ii) ablating from the side carrying the wave guiding film to the remaining depth of the wafer and a width equal to the desired air gap. To accommodate a larger tolerance in the placement of the air gap within the ablated area across the visually opaque VESPEL® wafer, the area ablated from the uncoated back side of the wafer is made wider than the desired air gap width.

Accordingly, the fabrication of a cantilever includes: cutting the shape of the cantilever with $CO_2$ laser without releasing it, ablating the narrow region of the VESPEL® wafer with excimer laser and ablating the air gap concurrently to release the cantilever, and ablating the input/output edges of the waveguide film with an excimer laser, not necessarily in this order.

EXAMPLE 2

Laser Micromachined Cantilever Beam with Ablated Input/Output Edges

A cantilevered waveguide was fabricated in a polished VESPEL® wafer according to the procedure outlined above by following the sequential steps of:

(a) forming an unreleased cantilever contour by cutting the VESPEL® wafer with a $CO_2$ laser, (b) ablating the input/output edges of the waveguide film with an excimer laser, and (c) ablating the narrow region of the VESPEL® wafer with the excimer laser and ablating the air gap concurrently to release the cantilever.

Figure 1D:
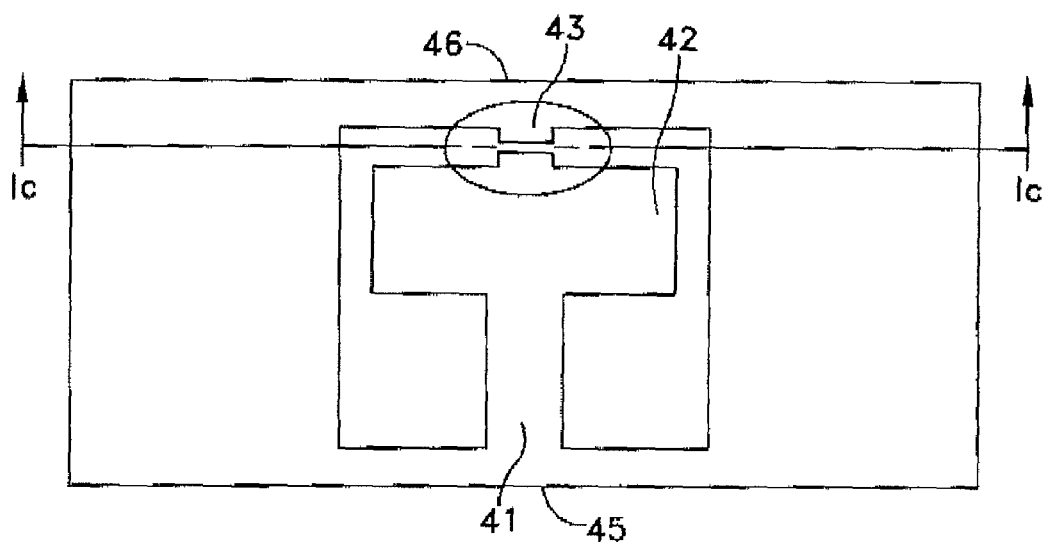
FIG. 1d shows schematically a top view of the cantilever structure of FIG. 1a after release by ablation of the gap with an excimer laser.
Figure 1B:
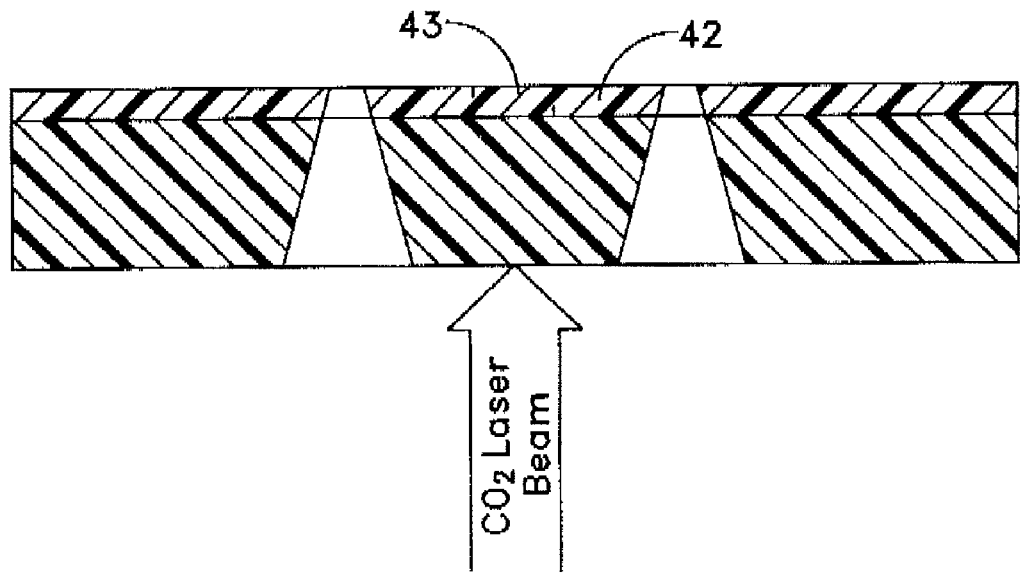
FIG. 1b shows schematically a cross-sectional view of the cantilever structure of FIG. 1a taken along the line Ib-Ib.
Figure 1C:
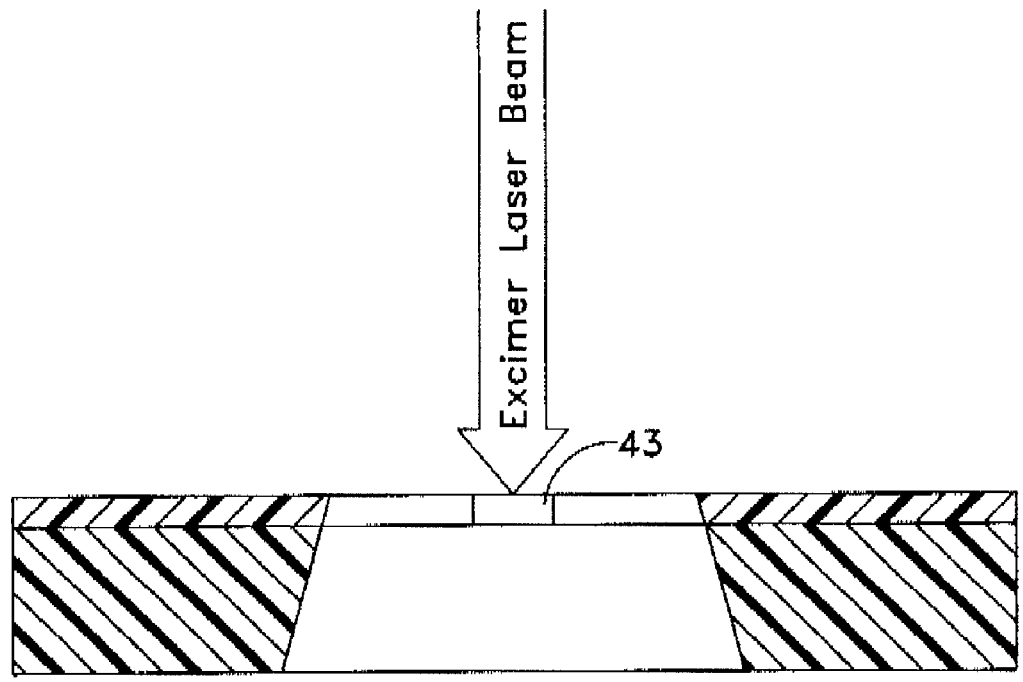
FIG. 1c shows schematically in cross section ablating with an excimer laser a gap for releasing the cantilever structure of FIG. 1a, with the cross section taken along the line Ic-Ic of FIG. 1d.

The cantilevered waveguide of example 2 is shown schematically in FIGS. 1a-1d. The polished VESPEL® wafer is 25 mils (625 µms) thick. The line drawings were prepared from an SEM image. The main cantilever section denoted by 41 in FIGS. 1a and 1d is 50 mils long by 25 mils wide. The area 42 representing the inertial mass is 110 mils long by 70 mils wide. As indicated in FIG. 1b, a $CO_2$ laser directed from the back side of the wafer creates most of the contour of the cantilever except for a narrow—approximately 10 mils wide—region 43 at the location where the air gap is subsequently formed by excimer laser ablation. The $CO_2$ laser does not release the cantilever but keeps it suspended from the narrow region 43. The input edge of the waveguide film is denoted by 45 and the output edge of the waveguide film is denoted by 46. After formation of most of the contour of the cantilever (except the narrow region) with a $CO_2$ laser, the wafer is ablated with an excimer laser from the uncoated backside at region 43 to a depth of 550 µm and width of 50 µm. The wafer is then ablated with an excimer laser from the front side carrying the waveguide, as indicated in FIG. 1c, to a depth of 75 µm and a width equal to that of the desired air gap. The total ablation depth is equal to the thickness of the wafer. The cantilever is released by concurrently ablating the air gap in region 43 of the waveguide film and the VESPEL® material underneath. The portion of region 43 adjacent to the output edge 46 is not necessary. The light exiting the cantilevered waveguide can be picked up directly by a fiber or adjacent waveguide.

EXAMPLE 3

Laser Micromachined Cantilever Beam with Diced Input/Output Edges

A cantilevered waveguide similar to that given above in Example 2 was fabricated in a polished VESPEL® wafer, except that the input/output edges of the waveguide film in step (b) were diced instead of laser-ablated (not shown).

Figure 2:
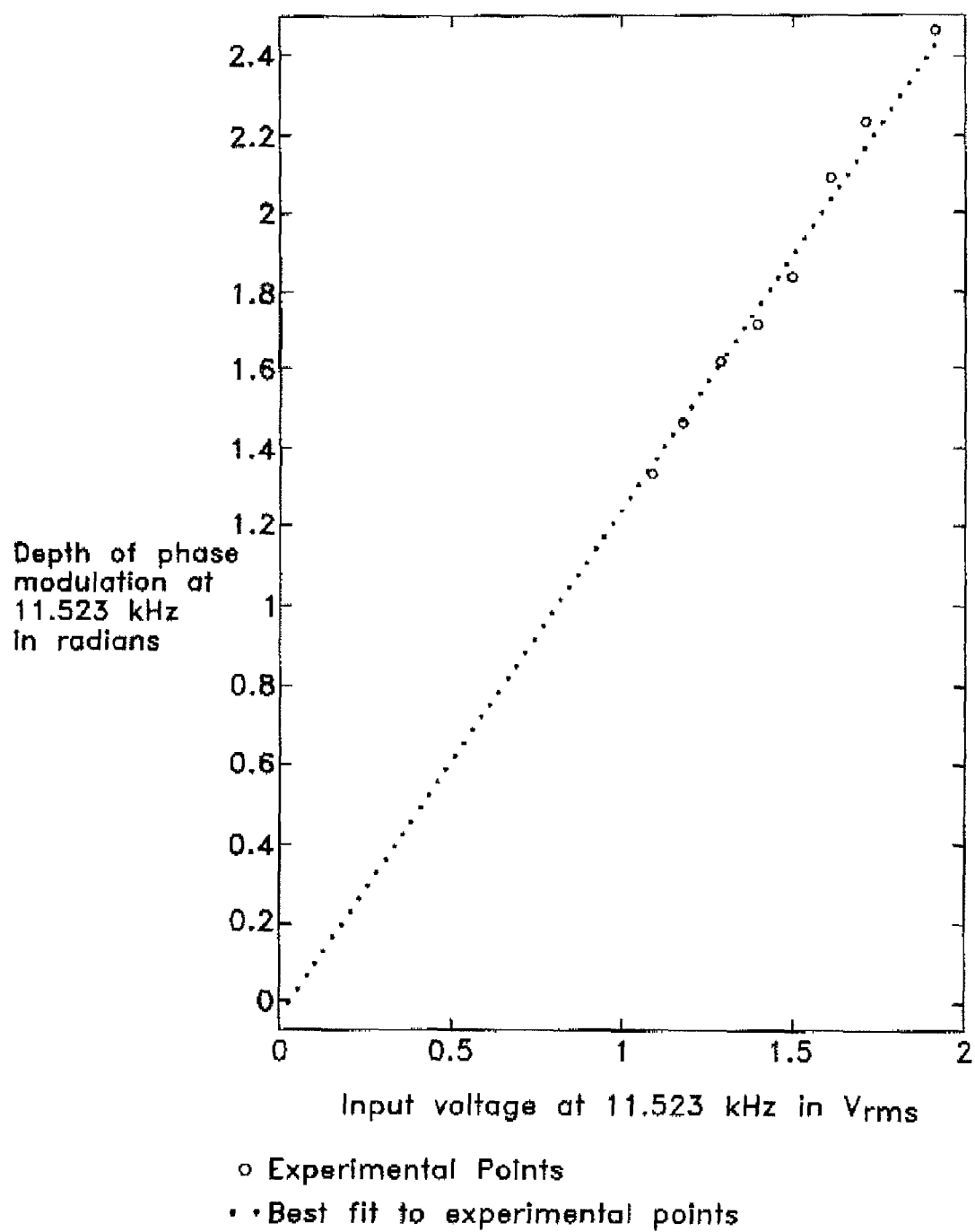
FIG. 2 is a schematic diagram of a phase modulation in radians vs. RMS drive voltage applied to a piezoelectric plate.

The displacement of the cantilever causes a change in the length of the path of the light passing through the cantilevered waveguide, which is measured interferometrically. In an exemplary measurement, a section of straight planar waveguide incorporating a micromachined cantilever is inserted in one arm of a fiber optic Mach-Zehnder interferometer. The cantilever is driven with a piezoelectric sheet made from PZT material to simulate acceleration. The piezoelectric plate is driven longitudinally near its resonance to attain maximum displacement. The resonant frequency of the piezoelectric plate was 11.523 kHz. Application of a sinusoidal voltage to the piezoelectric plate generated dynamic displacements of the cantilever, which were picked up as optical phase change by the interferometer. FIG. 2 displays a graph of the phase change in radians vs. the drive voltage applied to the piezoelectric sheet. A linear fit to this plot provided the value of the phase shifting coefficient, which is the phase change per unit voltage. A value of 1.281 rad/$V_{rms}$ was determined at f=11.523 kHz, corresponding to an optical path length change of 0.127 µm per µm of lateral cantilever tip displacement.

The cantilevered waveguides of Examples 2 and 3 can be used, for example, in an interferometric optical accelerometer, or an optical switch for routing of light in optical telecommunications networks.

Figure 3:
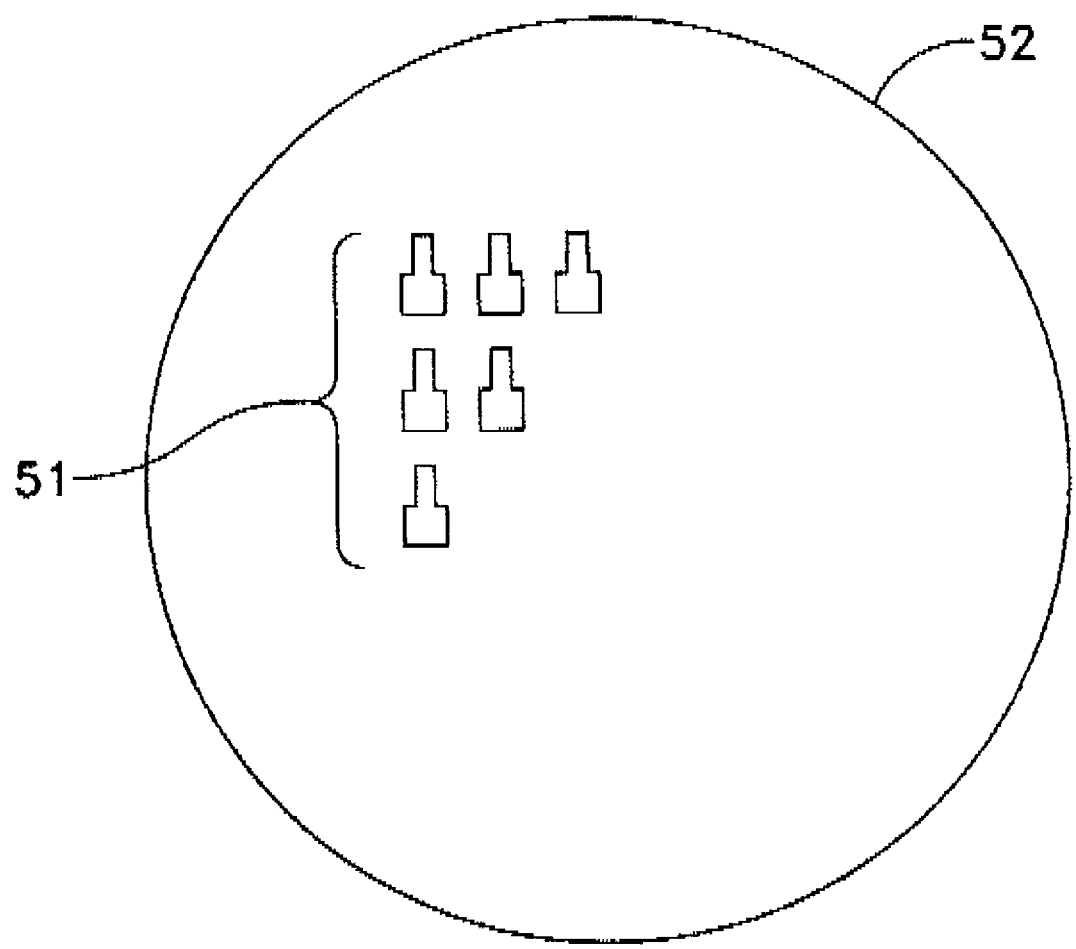
FIG. 3 shows schematically a pattern of cantilevers cut in a polished VESPEL® wafer using a $CO_2$ laser.

FIG. 3 shows a pattern of adjacent cantilevers 51 cut with a $CO_2$ laser and released with excimer laser, in a polished VESPEL® wafer 52. The $CO_2$ laser cuts the entire pattern of cantilevers in a single traversal of the wafer. The wafer is scanned relative to the stationary $CO_2$ laser. The excimer laser is stepped and repeated across the wafer area to release all the cantilevers in the pattern.

EXAMPLE 4

Fabrication of a Groove for Mounting a Fiber

Figure 4:
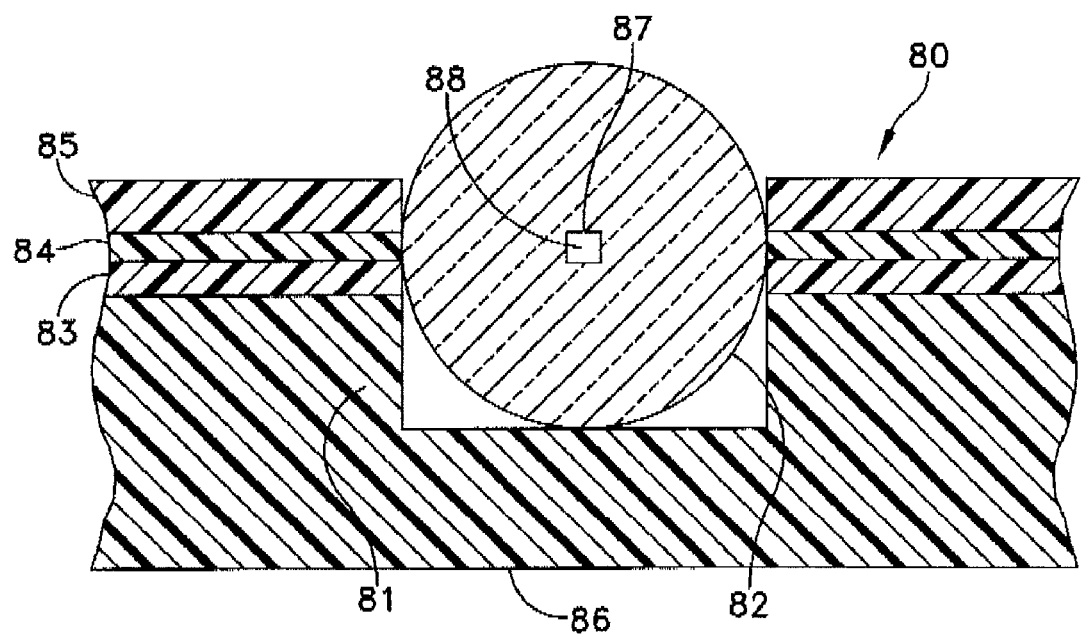
FIG. 4 shows schematically a cross-sectional view of an optical fiber located in a groove laser-machined in a polyimide/polymer laminate.

A groove is fabricated in a polished polyimide wafer by laser ablation to hold a fiber for attachment to a channel waveguide. The groove is parallel and collinear with the channel waveguide. The edge of the channel waveguide adjacent to the groove is prepared by laser ablation. The fluence of the ablating laser and the optical delivery system can be adjusted to yield a smooth and vertical groove with sub-micron accuracy, which holds the fiber tightly horizontally and vertically. An optical fiber is inserted in the groove by pressing. It is translated axially until its tip contacts the edge of the waveguide. The depth and width of the groove can be controlled very precisely within about half a micron (or about 0.5 dB optical loss) so that the axis of the fiber core coincides with the axis of the waveguide. The accuracy of the vertical alignment between fiber and waveguide depends on the accuracy with which the groove depth can be controlled. This is very precisely known from knowledge of the number of pulses and the ablation rate of the material per pulse. The ablation rate depends on the fluence of the laser, i.e. energy density per pulse. A typical ablation rate for polyimide is about 0.5 µm/pulse. For example, if the waveguide core layer is centered at a distance of about 10 µm above the polished substrate surface, then assuming a fiber radius of 62.5 μm, the bottom of the groove must be at a distance of 52.5 μm below the substrate surface. At a rate of approximately 0.5 μm/pulse, it would take about 105 pulses to form the groove. The accuracy of the horizontal alignment between fiber and waveguide depends on the accuracy with which the groove width and location can be controlled. This is very precisely controlled with the use of standard photolithographic stepping processes. This yields the desired accuracy for coupling light between single mode fibers and waveguides. A cross section of a laminate 80 comprising a groove 81, fiber 82, and waveguide comprising a first optical buffer (lower cladding) layer 83, a second optical wave guiding (core) layer 84, and a third optical (upper cladding) layer 85 on top of a substrate 86 is shown in FIG. 4. The center of the channel waveguide 87 in the core layer 84 coincides with the center of the fiber 88. The groove is imaged on the laminate through a reticle. The groove can be fabricated with an excimer laser, which emits pulses typically on the order of nanoseconds long. Alternatively, the groove can be fabricated with lasers, which emit picosecond or femtosecond pulses for a more precise control of the groove dimensions.

EXAMPLE 5

Micromachined Cantilever Moving Parallel to Surface of Substrate

Figure 5:
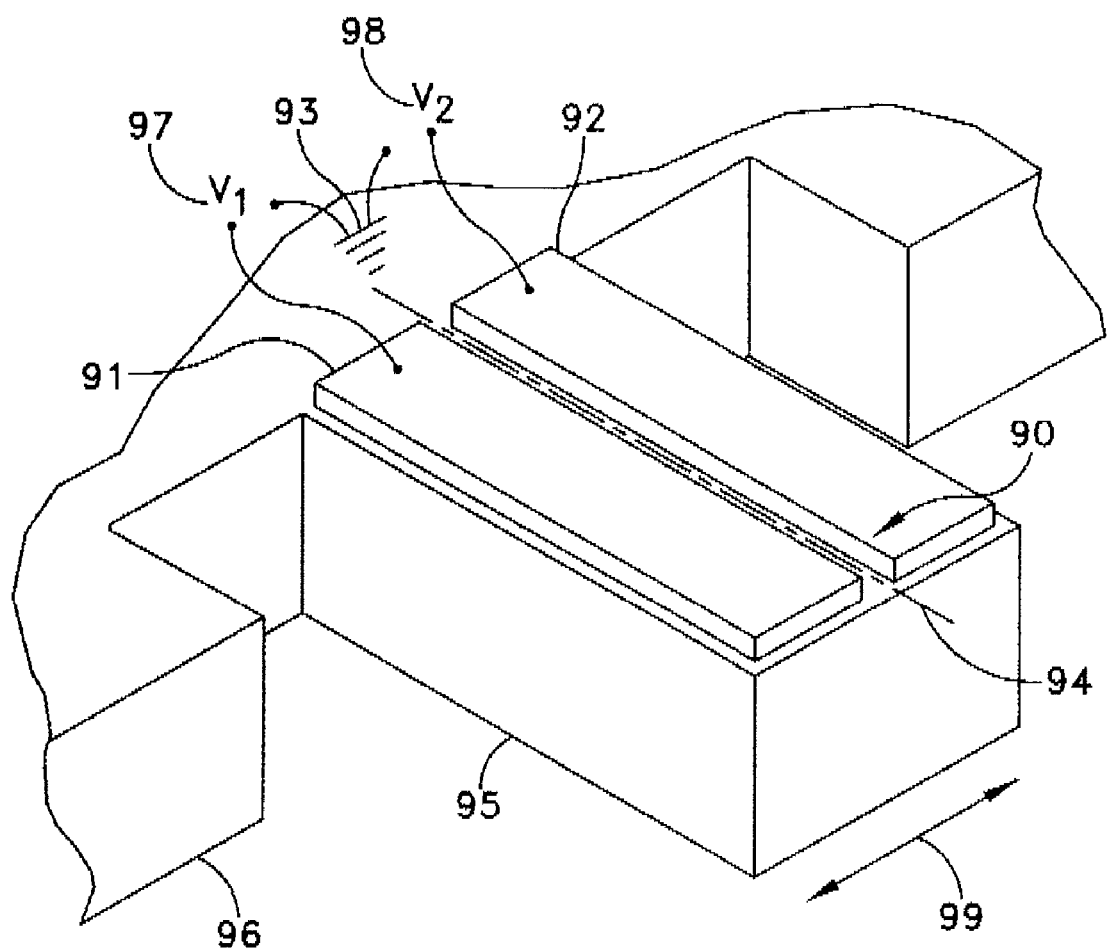
FIG. 5 shows schematically a perspective view of a cantilever with two sections of a piezoelectric laminate divided along a neutral axis of the cantilever.

A metal/piezoelectric laminate 90 disposed on a polished polyimide substrate 96 is shown in FIG. 5. A cantilever 95 is micromachined in the substrate 96. The laminate 90 is ablated with an excimer laser along a neutral axis of the cantilever 94 to create two sections of laminate 90 having a common electrical ground 93, a left section 91 and a right section 92. When two different voltages $V_1$ 97 and $V_2$ 98 are applied to the left and right sections 91 and 92, respectively, the cantilever moves in a direction 99 parallel to a surface of substrate 96.

A polyimide wafer can be drilled with laser to form an array of holes. The holes can have diameters less than 100 μms and center-to-center spacing less than 200 μms. Typically, holes having a diameter of about 50 μms or less and spaced 100 μms center-to-center are drilled in the polyimide wafer using either excimer laser emitting at 248 nm or 193 nm, or tripled YAG laser emitting at 355 nm to produce microvias suitable for microelectronic interconnections. Through holes as well as blind via holes can be fabricated.

EXAMPLE 6

50 μm diameter holes on 100 μm pitch drilled with laser

Figure 6:
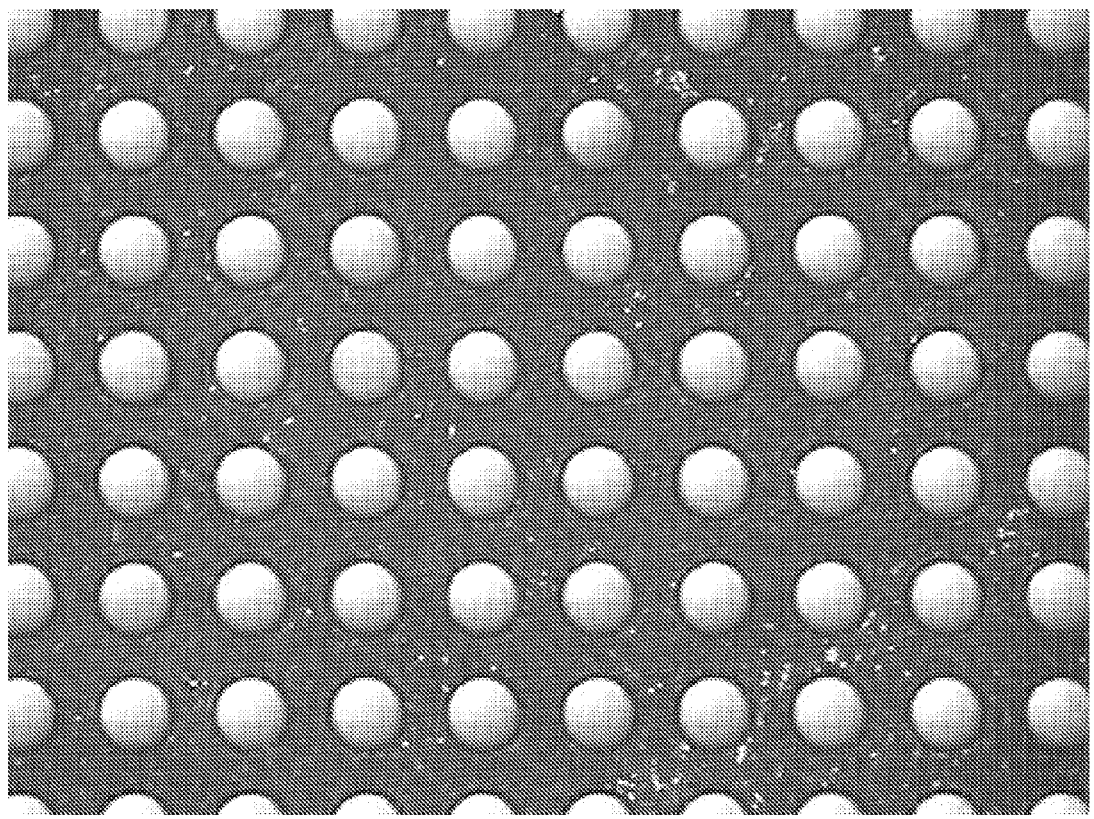
FIG. 6 shows an array of 50 µm holes on 100-µm pitch drilled with excimer laser.
Figure 7:
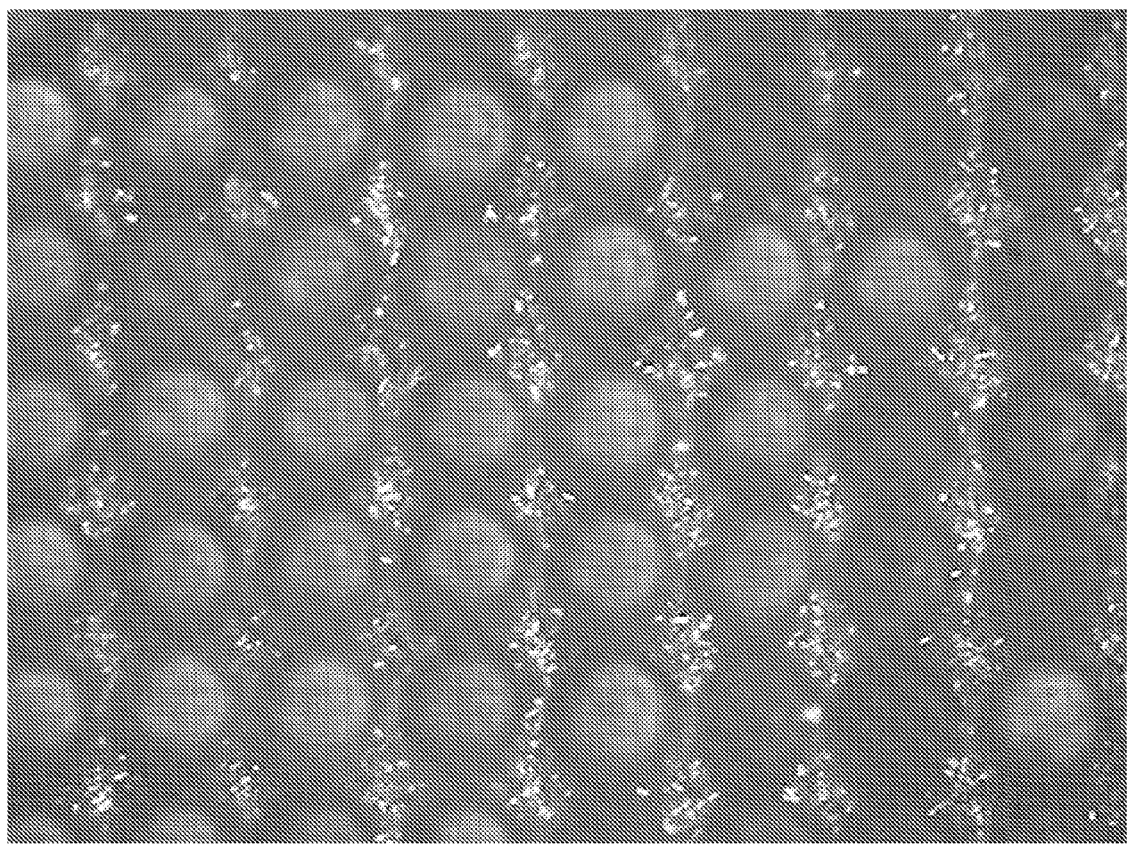
FIG. 7 shows an array of 50 µm holes on 60-µm pitch drilled with tripled YAG laser.

50 μm diameter through-holes on 100 μm pitch (center-to-center) are drilled through a polyimide wafer using an excimer laser, as shown in FIG. 6. An array of more densely packed holes of the same diameter on a 60 μm pitch drilled using a tripled YAG laser is shown in FIG. 7. The half-cone taper angle obtained with the excimer laser is about 0.75°. 25 μm diameter holes can be fabricated with either laser. This enables the fabrication of 50 μm pads covering the holes for electrical contact.

The holes are fabricated either sequentially by stepping the wafer under the focused YAG laser beam, or by imaging the excimer laser through a reticle on the wafer. Both techniques achieve an accuracy of a few microns in the registration of the holes. The pads are fabricated photo-lithographically with the use of a mask. The overlap between the pads and holes depends on the alignment between the two patterns. This can be achieved with the use of a mask aligner. The use of a polyimide wafer (preferably between 150 and 250 μms thick) allows finer alignment and better feature registration. This will push the current pitch limit from 200 μm down to 100 μm.

A typical hole for high density interconnect has a diameter less than 50 μms. Thus, the hole has an aspect ratio between 3 and 10:1. Direct metallization, which is an alternative to electroless copper plating, is used to coat the cylindrical walls of the holes. This ensures reliable electrical connection between both sides of the wafer. This technique is particularly effective for coating high aspect ratio holes with diameters of 50 μm or less. The cylindrical wall of the hole is coated with a metallic film about 5 microns thick. The roughness of the laser-drilled hole enhances the adhesion of the metal film to the wall.

A polyimide wafer is cladded on both sides with a metallic film by sputtering or evaporation followed by electroplating. A thin metallic seed layer consisting typically of 300 Angstroms of chromium or titanium followed by 3000 Angstroms of Copper or gold is sputtered on both sides of the wafer. It is then electroplated with copper up to 1 μm. Equal amounts of metal are removed from each side of the wafer to create metallic traces while preserving symmetry. The holes can be drilled either before or after cladding of the polyimide wafer. Carbon debris may deposit on the surface of the wafer during ablation, which can affect the adhesion of subsequent layers. The carbon deposit is dissolved with polyvinyl alcohol. Once the holes are drilled, the vertical walls of the holes are ready for direct metallization. Direct metallization utilizes different chemistry from electroless copper plating, which can coat 50 μm holes because it does not cause hydrogen evolution during metallization. Direct metallization uses low viscosity solutions and avoids the use of Formaldehyde, which is carcinogenic.

Direct metallization can be achieved using at least two alternative chemical systems, namely Palladium colloidal or conductive polymer. In particular, the polymer, such as the one supplied by Enthone, Inc., West Haven, Conn., is almost as conductive as copper and specifically designed to provide complete coverage of blind vias and high aspect ratio holes with 100 μm diameter or smaller. The system activates the cylindrical surface of the polyimide by supplying manganese, which gets absorbed by the polyimide in the tiny hole. The Manganese is not absorbed by copper, which covers the horizontal surface of the polyimide wafer. Subsequently, the system supplies a monomer that polymerizes upon reacting with the manganese to create the conductive polymer. Thus, the conductive polymer sticks to the cylindrical wall where the manganese was absorbed and provides a continuous electrical connection from one side of the wafer to the other. The success of the direct metallization process hinges on the flow of manganese through the tiny hole. The roughness of the wall of the hole enhances these chemical reactions.

The direct metallization layer serves as a seed layer on the vertical cylindrical wall, in much the same way the sputtered layer serves as a seed layer on the flat surface. It is only about 0.5 μm thick and follows the contour of the vertical wall conformally. It has a high electrical resistance because it is very thin. It must be followed by electroplating to build up the layer to the desired thickness, usually between 3 and 5 μm, to reduce the resistance. Electroplating can be continued until the hole is completely filled if so desired.

After successful metallization of the vias, the pads are fabricated using either the subtractive or additive process following standard photolithographic procedures.

The drilled and metallized polyimide wafers are aligned, stacked on top of each other and attached using flip chip bonding techniques to provide multi-layered high density three-dimensional microelectronic interconnects suitable for packaging of chips. The stacked polyimide substrate overcomes the limitations of organic and ceramic substrate technologies.

EXAMPLE 7

Assembly of Multi-Layered Polyimide Substrate

Polyimide wafers of suitable thickness are cladded with thin metallic layers as described above. Holes are drilled with laser in each wafer separately. Different wafers can have different thicknesses and different hole patterns. The wafers are metallized using direct metallization and electroplated to create the pads and provide secure electrical connections across each wafer. The wafers are patterned to create horizontal metallic traces and isolate adjacent vertical vias. The wafers are stacked on top of each other in order according to the electrical circuit layout and aligned using fiduciaries, which are commonly used in semiconductor wafer alignment. The locations of the pads in two mating surfaces coincide. The pads are attached using electrically conductive bumps similar to those used in flip chip bonding for die attachment. Thus, the successive layers of the substrate can be attached internally similarly to the way the chip is attached to the upper layer using stencil-printing technology. The use of conductive bumping technology provides electrical contact as well as mechanical ruggedness and eliminates the need for adhesive layers between the successive wafers.

The materials that are commonly used for flip chip bumping are conductive polymer epoxies, which perform simultaneous functions for electrical connection and mechanical adhesion. In particular, Epotek brand epoxies, manufactured by Epoxy Technology Inc., Billerica, Mass., are available and widely used for a variety of flip chip bonding applications because of its good electrical and adhesive properties. Epotek is a thermoset polymer, which cures at low heat, without the need for UV radiation, and which does not contain any solvents. These features make it attractive for stacking polyimide wafers because it can be easily cured between two opaque wafers. Stencil printing is an inexpensive technology for depositing polymer bumps, which is widely used in flip chip bonding applications. Suitable bumps for polyimide wafer attachment can be produced by stencil printing using a stainless steel stencil with aperture diameters of about 70 µm. Finer bumps with a diameter of about 50 µm can be obtained with the use of an electroplated Nickel film. A 100 µm pitch can be achieved using stencil printing technology. This technology is a low cost alternative to electro-plated solder and indium bump bonding, which can achieve a smaller pitch below 50 µm.

A grid array of conductive epoxy bumps can be placed at 100 µm pitch on a polyimide wafer with a 10 µm placement accuracy. The electrically conductive bumps provide sufficient mechanical strength and adhesion due to the significant number of bumps in the array, that additional mechanical reinforcement may not be necessary. However, supplemental mechanical ruggedness and adhesion between stacked layers can be provided by stencil printing non-conductive epoxy bumps along the periphery of the wafer at a coarser pitch outside the area of the microvias. These bumps would be used only for the purpose of reinforcing the assembly mechanically but would not provide any electrical functionality. Further, the epoxy dispensed around the perimeter would not interfere with the functionality of the polymer bump-bonded microvias because it is non-conductive. A combination of conductive and non-conductive epoxies bumps can be used to assemble the substrate.

Figure 8:
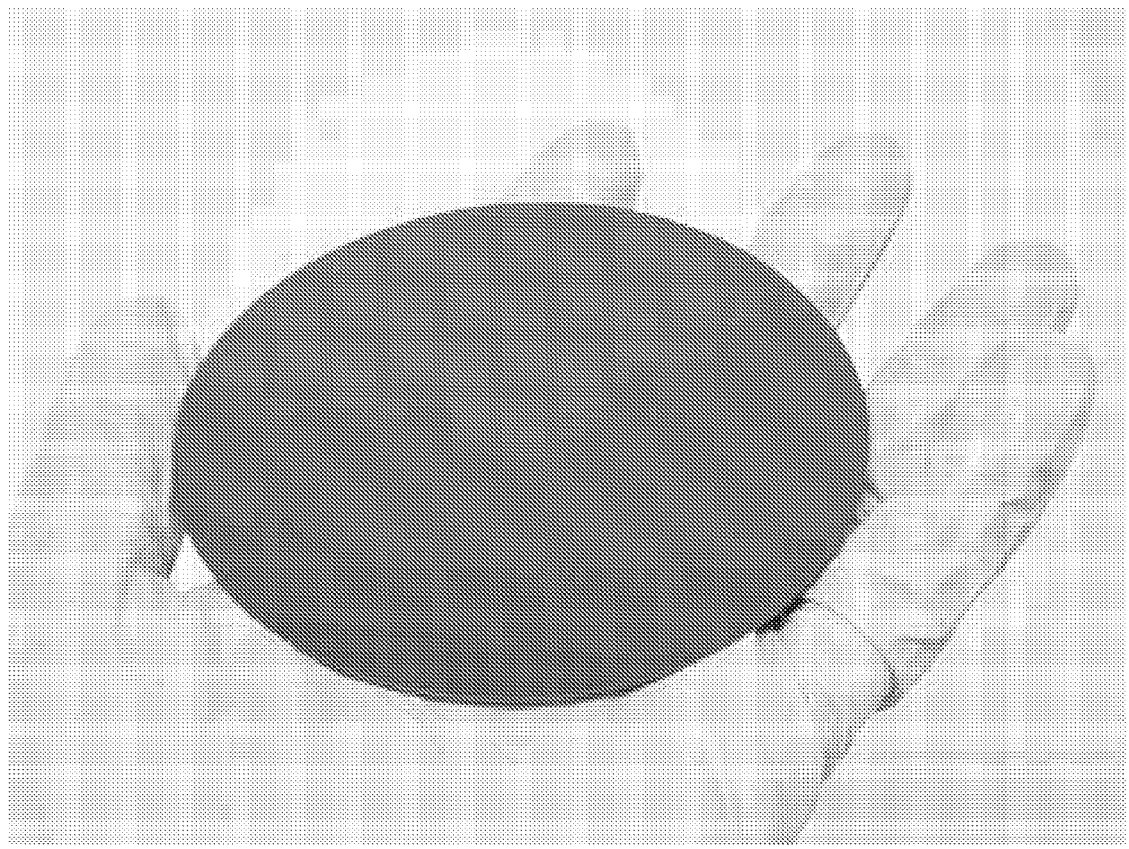
FIG. 8 shows a 4-inch diameter polished flat polyimide wafer
Figure 9:
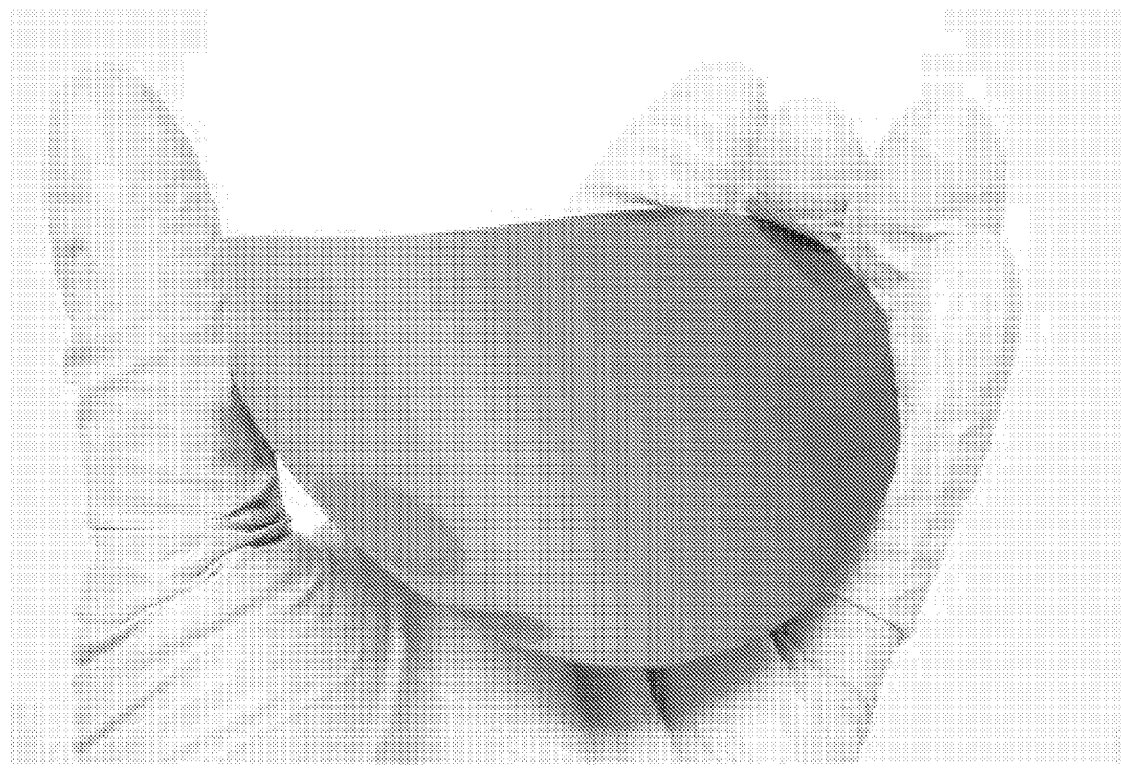
FIG. 9 shows a flexible polyimide wafer

The properties of polyimides, like all polymers, are influenced by the way they are fabricated. There are three types of polyimides:
1) solvent-based spin-on films, which are widely used as passivation layers between metal layers,
2) polyimide sheet like Kapton, and
3) bulk polyimide The polyimide substrate is made of bulk polyimide material, which is compacted isostatically under heat to obtain a boule. The boule is then sliced and polished to yield individual wafers. This method yields semi-crystalline opaque polyimide material, which is of the highest quality. The crystallinity of the substrate allows the surface to be polished to mirror-like finish. The polyimide substrate is not solvent-based. The polyimide substrate is superior to Kapton sheet and Kapton laminates at high temperatures. The polyimide substrate can be used at temperatures above 500° C. Compared to Kapton, it has the main advantages that it is more isotropic, absorbs water 10 to 30 times less, and that its physical, dielectric and thermal properties, such as coefficient of thermal expansion (CTE), remain constant over a wide temperature range. It has exceptional dimensional stability and resistance to corrosive chemicals. It exhibits less than 0.04% variation from its original dimensions after cycling from 23° C. to 260° C. over a two-day period. The bulk polyimide material is used for space applications. The bulk polyimide has the advantages of low dielectric constant, low loss, smooth surface, flexibility, thermal, dimensional and environmental stability. The bulk polyimide provides the best substrate material for advanced packaging of high performance thin opto-electronic devices and circuit layers, such as SOI devices and multi-junction solar cells. It provides stress-free substrates compared to built-up thick films that are obtained by successively spinning polyimide, BCB or SU-8 layers on semiconductor wafers. FIGS. 8 and 9 show pictures of the polyimide wafer.

The polyimide wafer was metallized by sputtering followed by electroplating using different metals. The adhesion of all metals was measured using a stud-pull test and found to be excellent. The polyimide wafer withstands vacuum. There was no outgassing or contamination of the sputtering chamber. Features below 1 µm can be created photolithographically on the polished polyimide wafer. The polyimide substrate was drilled with laser to ablate tiny holes with diameter below 50 µms. Holes with high aspect ratios can be metallized to create high-density vertical vias. The polyimide wafer was fusion bonded to silicon and glass wafers without any adhesive. It was also bonded using BCB and epoxy. The polyimide wafer can be bumped and stacked to provide high-density 3D interconnects.

Devices are fabricated in single crystal silicon or Ge or GaAs wafers at high temperatures using processes, such as CMOS and MOCVD, and then transferred wafer-scale to the polyimide substrate. Devices and circuits can also be transferred chip-scale. This preserves the high performance of the device in its new environment. This yields high-performance circuits, which cannot otherwise be fabricated on the flexible substrate directly due to temperature limitations. Single crystal devices, such as SOI and multi-junction solar cells, and circuit layers have not been transferred previously to flexible substrates.

Adding patches or islands of high-density circuits can improve the performance of large area circuits, up to a few square meters. The polyimide substrate interfaces with these large area sheets or rolls because of its flexibility. A polyimide substrate carrying a high-density circuit can be scribed and diced with laser and mounted on a large sheet carrying metal interconnects. Through-holes or vias are drilled in the polyimide substrate with laser or by reactive ion etching and metallized to provide electrical connection between the high-density circuits and the metal interconnects on the sheet. The high performance circuits fabricated on silicon wafer are first transferred to the polyimide substrate, which is then patched to the large area sheet to create a rolled circuit. Similarly, high efficiency solar cells fabricated on Ge or GaAs wafers are first transferred to the polyimide substrate, which is then patched to a large area sheet to create a flexible solar panel.

Figure 10A:
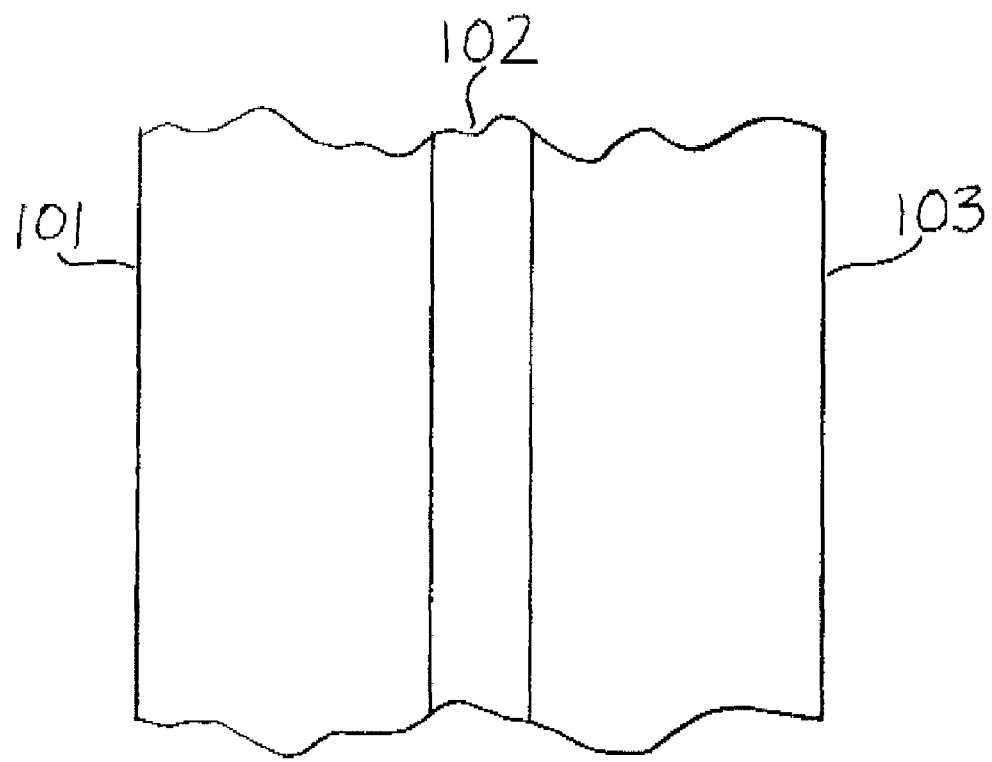
FIG. 10a shows schematically a polyimide substrate bonded to a semiconductor wafer

FIG. 10a shows schematically a polyimide substrate 101 bonded to a semiconductor wafer 103 through glue 102.

The polyimide substrate supports the semiconductor wafer during thinning and provides a permanent carrier for the thin silicon, germanium or gallium arsenide layer. This eliminates the risk of breakage associated with de-bonding. The polyimide substrate can also provide a permanent carrier for a CIGS or CdTe film.

The choice of glue between the thinned wafer and the polyimide substrate is the most critical element for the success of the thinning process. The quality of the bonding is essential. Thinning is done either mechanically or chemically or a combination of both. The flatness and smoothness of the thinned layer depend on the strength and uniformity of the bond. Glues, such as single or two-component epoxies, which are commercially available from companies like Emerson & Cuming, Billerica, Mass., and commonly used in the IC industry. Permanent glues are more readily available than temporary glues. The glue must be flexible to accommodate any thermal strain between the polyimide and semiconductor wafer without breaking. The epoxy is typically less than 25 µm thick, preferably less than 2.5 µm thick. Curing of the epoxy is preferably done at low temperature in order to reduce thermal stresses due to the mismatch of the coefficients of thermal expansion. It is not possible to use a UV curable epoxy between the semiconductor and polyimide wafers because neither one is transparent to UV.

Figure 10B:
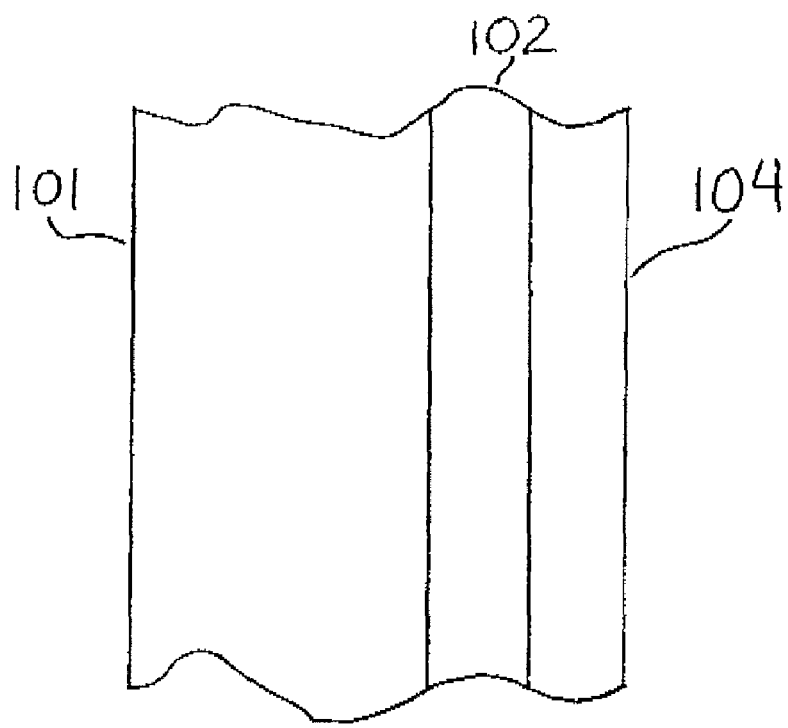
FIG. 10b shows schematically a polyimide substrate bonded to a thinned semiconductor wafer

The composite structure consisting of the polyimide substrate, adhesive layer and the semiconductor wafer is subsequently thinned mechanically by grinding and lapping to the final thickness. Chemical wet as well as dry etching can be used to remove any surface damage due to grinding and lapping. The bonding must withstand the grinding and thinning processes. FIG. 10b shows schematically the polyimide substrate 101 bonded to the semiconductor wafer 104 after thinning. The polyimide substrate can also be thinned after bonding. The outside surfaces can be subsequently polished. Polishing after lapping reduces the surface damage caused by lapping. This technique sacrifices the donor wafer. Alternatively, sacrificial layers can be incorporated in the semiconductor wafer, which permit lift-off of the thin SOI or epi-layer and reuse of the donor wafer.

A lapped surface has an average roughness between 0.25 and 0.5 µm or equivalently between 10 and 20 µinch. The glue actually attaches better to a rough lapped surface than to a smooth polished surface. Thus, it may not be necessary to polish the side of the polyimide substrate facing the semiconductor wafer. The semiconductor wafer carrying the devices is usually polished and its backside is polished after thinning.

The layer transfer process can be done in either one or two steps, i.e. the polyimide substrate can be either bonded directly to the semiconductor wafer; or a glass handle wafer can be used to transfer the thin SOI or epi-layer from the donor wafer to the polyimide substrate. The fabrication process is determined by the functionality of the polyimide substrate, i.e. whether it provides only mechanical support or whether it plays an electrical role as well. There are two ways of mechanically attaching two wafers: either with the use of epoxy or by bumping. In the latter, solder or conducting polymer balls are dispensed on gold coated aluminum pads, which are then re-flowed under heat to provide electrical contact, similar to flip chip mounting of chips. If the polyimide substrate provides only mechanical support then it can be glued to the semiconductor wafer with non-conducting epoxy. The bond must be strong enough to withstand the grinding. Low temperature curing epoxy can be used to mitigate the effects of thermal stress due to the mismatch between the coefficients of thermal expansion. No alignment is necessary between the semiconductor wafer and polyimide substrate. However, if the polyimide substrate provides electrical functionality such as fine metal lines or through hole interconnects between silicon islands on the wafer, then the polyimide substrate is metallized and provided with aluminum pads, which match those on the semiconductor wafer. The mask layout provides metallic pads on both sides of the SOI or epi-layer for electrical connections. The wafers must be aligned and bumped prior to bonding. The transparency of the glass wafer helps with alignment. The bumps provide mechanical attachment as well as electrical connection. In this case it would be preferable to use a two-step transfer process in order to avoid putting undue stress on the conducting bumps during grinding and to avoid debris from getting between the bumps. The use of glass handle wafer allows transfer of a thin device layer to the polyimide substrate but avoids direct bonding and thinning of the semiconductor wafer on the polyimide substrate. The semiconductor wafer is first bonded to the glass wafer using dissolvable adhesive and the SOI or epi-layer transferred to the glass. Subsequently, the polyimide substrate is bumped and aligned to the glass wafer and the SOI or epi-layer transferred to the polyimide substrate. In either case the back of the SOI or epi-layer can be bumped with solder or conducting epoxy balls after thinning and transfer to provide electrical contacts to the external world. The polyimide substrate carrying the devices can be diced and packaged using flip chip attachment techniques similar to a silicon chip.

EXAMPLE 8

Transfer of SOI Layer to Polyimide Wafer

Figure 11:
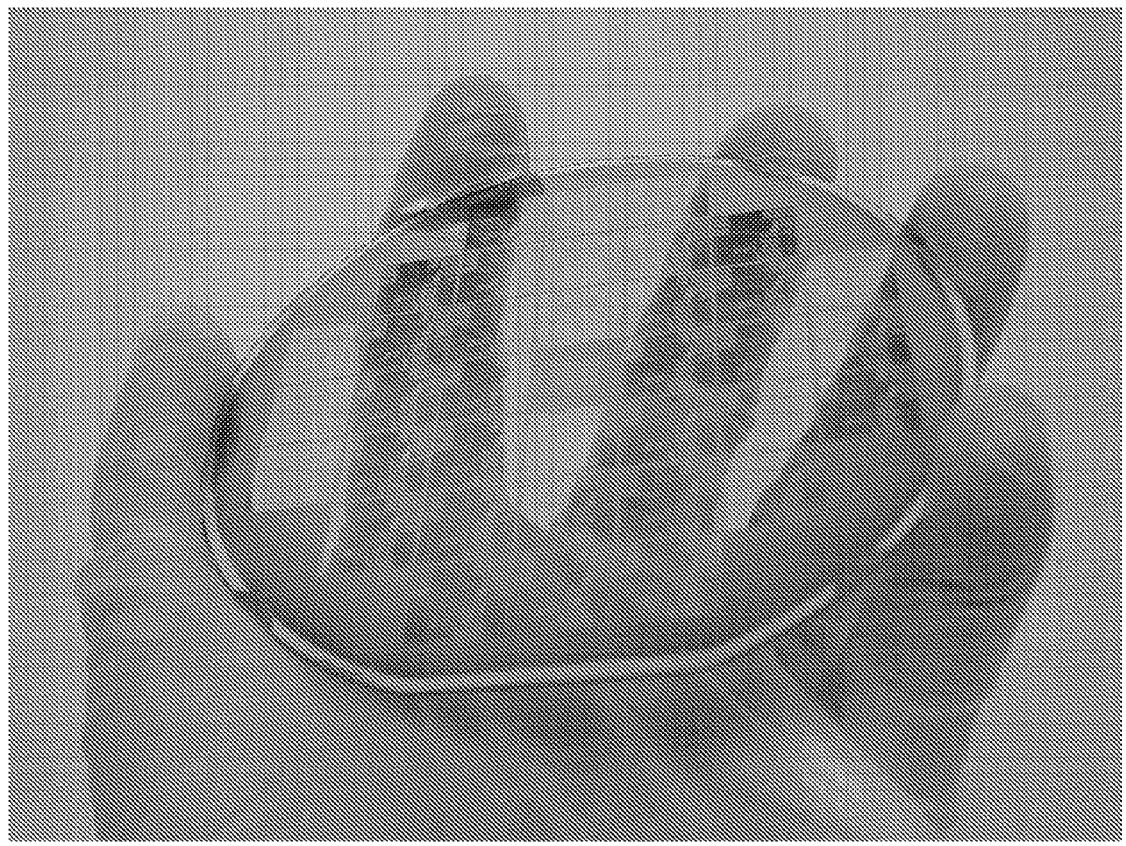
FIG. 11 shows a glass wafer carrying SOI circuit layer after thinning

A circuit containing silicon devices measuring 5 µm×5 µm×100 nm buried under silicon oxide layers and connected by metallic lines with a total thickness of a few microns is fabricated on an SOI wafer. The SOI wafer is bonded to a glass handle wafer on the side containing the devices using dissolvable epoxy. The SOI wafer is thinned by a combination of backgrinding and wet etching. The buried oxide of the SOI serves as the etch stop layer. After this step, the thin SOI layer with devices sits upside down on the glass wafer, as shown in FIG. 11.

Figure 12:
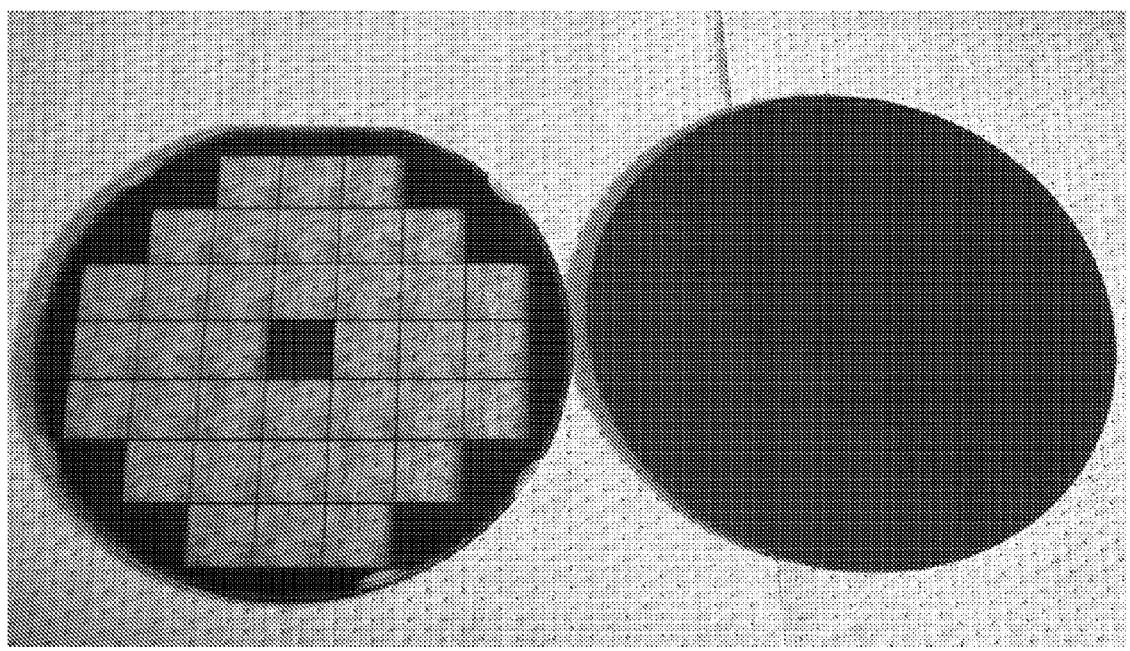
FIG. 12 shows glass wafer with SOI layer and polyimide wafer before bonding

Subsequently, the glass wafer with the inverted circuit is bonded to the polyimide wafer on the side containing the devices using permanent adhesive. FIG. 12 shows the two wafers side by side before bonding.

Figure 13:
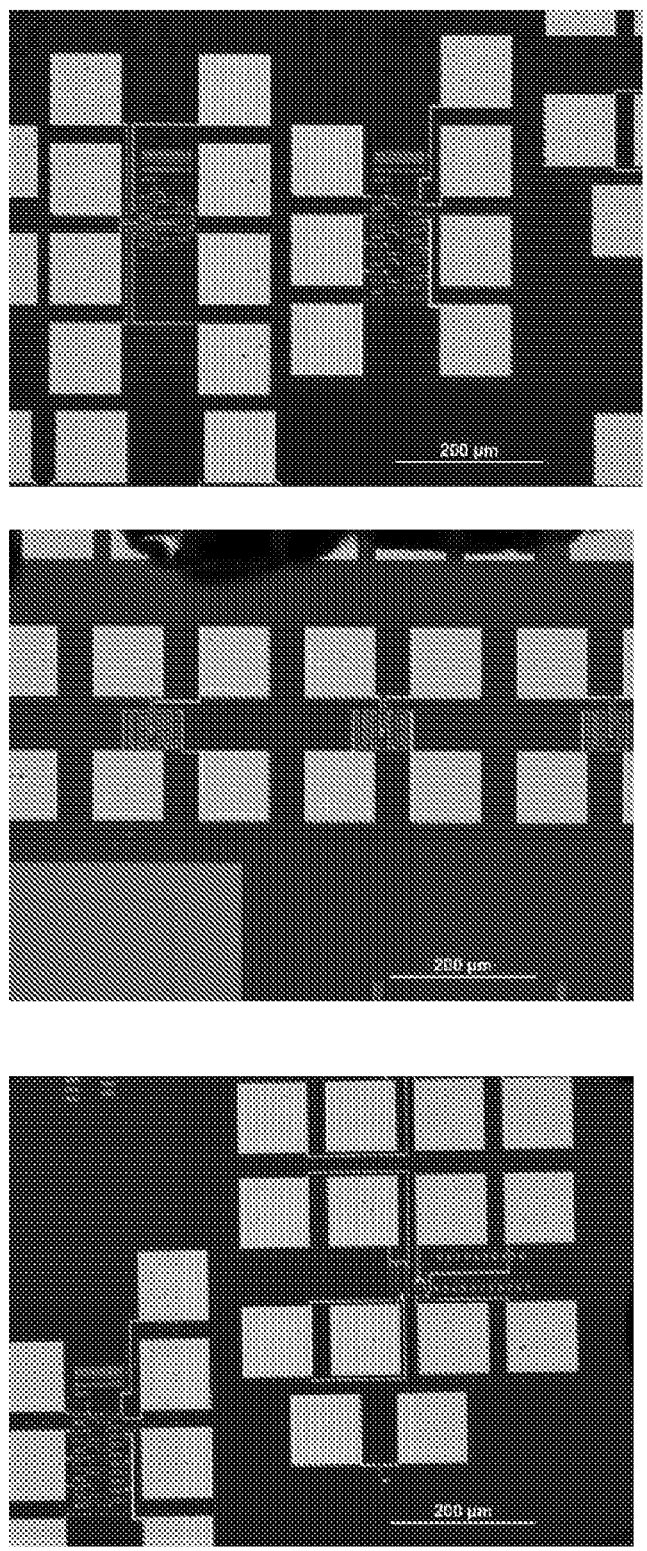
FIG. 13 shows SOI devices on polyimide wafer

The epoxy between the glass wafer and the SOI layer is subsequently dissolved by heating, thus freeing the glass handle wafer to be reused. Alternatively, the dissolvable epoxy can be ablated with laser through the glass wafer. After dissolution of the epoxy the SOI circuit layer remains permanently glued to the polyimide wafer facing upwards. FIG. 13 shows functioning SOI devices on the polyimide wafer.

The foregoing is considered only illustrative of the currently preferred embodiments of the invention presented herein. Since numerous modifications and changes may occur to those skilled in the art, it is not desired to limit the invention to the exact construction used to illustrate the various means comprising the invention.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A substrate for a circuit structure comprising:
a planar substrate mass of bulk polyimide material having a first side and a second side, said first side having a surface smoothness between about 0.025 μinch and 100 μinch, capable of receiving a circuit structure.

2. The substrate for a circuit structure of claim 1, wherein said polyimide is a thermoset polyimide.

3. The substrate for a circuit structure of claim 1, wherein said polyimide is a thermoplastic polyimide.

4. The substrate for a circuit structure of claim 1, wherein said thermoplastic polyimide is injection molded.

5. The substrate for a circuit structure of claim 1, wherein a second substrate is bonded to said first side of said polyimide substrate.

6. The substrate for a circuit structure of claim 5, wherein said bonding is by fusion without adhesive.

7. The substrate for a circuit structure of claim 5, further comprising an adhesive layer between said polyimide substrate and said second substrate.

8. The substrate for a circuit structure of claim 7, wherein said adhesive layer is made of single or two-part epoxy.

9. The substrate for a circuit structure of claim 5, wherein said second substrate is a semiconductor or glass wafer.

10. The substrate for a circuit structure of claim 9, wherein said semiconductor wafer is made of silicon, SOI, germanium, or gallium arsenide.

11. A method of preparing a substrate for a circuit structure comprising:
providing a planar substrate mass of bulk polyimide material having a first side and a second side; and
polishing said first side to a surface smoothness between about 0.025 μinch and 100 μinch.

12. The method of claim 11, further comprising:
shaping said planar polyimide substrate mass to form holes using at least one laser emitting in the ultraviolet spectral range.

13. A substrate for a circuit structure comprising:
a planar substrate mass of bulk polyimide material having a first side and a second side, said first side having a surface smoothness between about 0.025 μinch and 100 μinch, further comprising a semiconducting layer bonded to said first side of said polyimide substrate.

14. The substrate for a circuit structure of claim 13 further comprising an adhesive layer between said polyimide substrate and said semiconducting layer.

15. The substrate for a circuit structure of claim 14 further comprising a metallic layer between said adhesive layer and said semiconducting layer.

16. The substrate of claim 14 wherein said semiconducting layer is mono-crystalline.

17. The substrate of claim 16 wherein said semiconducting layer contains an electrical circuit.

18. The substrate of claim 17 wherein said electrical circuit is a photovoltaic solar cell.

19. The substrate of claim 18 wherein said semiconducting layer is grown epitaxially on a germanium wafer.

20. The substrate of claim 19 wherein said semiconducting layer is a multi-junction solar cell.

* * * * *